US012614849B2

(12) United States Patent (10) Patent No.: US 12,614,849 B2
Ye et al. (45) Date of Patent: Apr. 28, 2026

(54) ELECTRONIC DEVICE

(71) Applicant: HUAWEI TECHNOLOGIES CO., LTD., Shenzhen (CN)

(72) Inventors: Mao Ye, Xi'an (CN); Hanyang Wang, Reading (GB); Meng Hou, Shanghai (CN); Liang Xue, Shanghai (CN); Kun Li, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 32 days.

(21) Appl. No.: 18/722,437

(22) PCT Filed: Dec. 21, 2022

(86) PCT No.: PCT/CN2022/140767
§ 371 (c)(1),
(2) Date: Jun. 20, 2024

(87) PCT Pub. No.: WO2023/116780
PCT Pub. Date: Jun. 29, 2023

(65) Prior Publication Data
US 2025/0062533 A1 Feb. 20, 2025

(30) Foreign Application Priority Data
Dec. 23, 2021 (CN) .......................... 202111586570.X

(51) Int. Cl.
*H01Q 5/50* (2015.01)
*H01Q 1/24* (2006.01)
(Continued)

(52) U.S. Cl.
CPC .............. *H01Q 5/50* (2015.01); *H01Q 1/243* (2013.01); *H01Q 1/48* (2013.01); *H01Q 5/10* (2015.01); *H03H 7/38* (2013.01)

(58) Field of Classification Search
CPC ............ H01Q 5/50; H01Q 1/243; H01Q 1/48; H01Q 5/10; H01Q 5/25; H01Q 9/0407;
(Continued)

(56) References Cited

U.S. PATENT DOCUMENTS 10,547,101 B2 * 1/2020 Hwang .................. H01Q 9/145
2020/0036820 A1 1/2020 Lee et al.
2020/0350671 A1 11/2020 Kang et al.

FOREIGN PATENT DOCUMENTS

CN 112751174 A 5/2021
CN 112751213 A 5/2021
(Continued)

OTHER PUBLICATIONS

H. Li and Y. Li, "Mode Compression Method for Wideband Dipole Antenna by Dual-Point Capacitive Loadings," in IEEE Transactions on Antennas and Propagation, vol. 68, No. 8, pp. 6424-6428, Aug. 2020, doi: 10.1109/TAP.2020.2972642.

*Primary Examiner* — Seung H Lee
(74) *Attorney, Agent, or Firm* — WOMBLE BOND DICKINSON (US) LLP

(57) ABSTRACT

An electronic device includes a radiator, a feed point, and a ground point. The plurality of radiators include a first radiator, a second radiator, and a third radiator. A first end of the first radiator and a first end of the second radiator are opposite to each other, and form a first gap. A second end of the first radiator and a first end of the third radiator are opposite to each other, and form a second gap. The feed point and the ground point are disposed on the first radiator. The ground point is disposed in a central region of the plurality of radiators or the first radiator, and the feed point is disposed between the central region and the first end of the first radiator. Gaps are formed between a plurality of radiators, so that a broadband antenna can be implemented.

17 Claims, 16 Drawing Sheets

(51) Int. Cl.
 *H01Q 1/48* (2006.01)
 *H01Q 5/10* (2015.01)
 *H03H 7/38* (2006.01)

(58) Field of Classification Search
 CPC .......... H01Q 9/30; H01Q 5/357; H01Q 5/385;
 H01Q 1/22; H01Q 1/2266; H01Q 1/273;
 H01Q 1/38; H01Q 5/20; H01Q 25/04;
 H03H 7/38
 See application file for complete search history.

(56) References Cited

FOREIGN PATENT DOCUMENTS

| | | | |
|---|---|---|---|
| CN | 113013593 | A | 6/2021 |
| CN | 113013594 | A | 6/2021 |
| WO | 2021218800 | A1 | 11/2021 |
| WO | 2021244454 | A1 | 12/2021 |

* cited by examiner (a)

(b)

(a)

(b)

ELECTRONIC DEVICE

CROSS-REFERENCE TO RELATED APPLICATIONS

This application is a National Stage of International Application No. PCT/CN2022/140767, filed on Dec. 21, 2022, which claims priority to Chinese Patent Application No. 202111586570.X, filed on Dec. 23, 2021, both of which are hereby incorporated by reference in their entireties.

TECHNICAL FIELD

This application relates to the field of wireless communication, and in particular, to an electronic device.

BACKGROUND

With development of a fifth generation (5G) mobile communication system, an antenna in an electronic device has an increasingly urgent requirement for a broadband.

Considering factors such as an industrial design (ID) and an overall structure of an electronic device, an antenna of a conventional electronic device is usually designed for a small size and a small quantity of splits. However, this requirement conflicts with a characteristic of the antenna as an open system, and restricts performance of the antenna. Therefore, a series of auxiliary means such as adding a switch, a sensor, a circuit, and an algorithm are usually selected to improve performance of the antenna, so that the antenna meets a use condition of an increasing quantity of communication frequency bands. Consequently, complexity of an antenna system is significantly increased, and user experience and costs face challenges.

SUMMARY

Embodiments of this application provide an electronic device, including a plurality of radiators. Gaps are formed between the plurality of radiators, to implement a broadband antenna and meet requirements of a plurality of communication frequency bands.

According to a first aspect, an electronic device is provided, including a feed point, a ground point, and a radiator. The radiator includes a first radiator, a second radiator, and a third radiator. A first end of the first radiator and a first end of the second radiator are opposite to each other, and form a first gap. A second end of the first radiator and a first end of the third radiator are opposite to each other, and form a second gap. The feed point and the ground point are disposed on the first radiator. The ground point is disposed in a central region of the first radiator, or the ground point is disposed in a central region of the first radiator, the second radiator, and the third radiator. The feed point is disposed between the central region and the first end of the first radiator. When an electrical signal is fed at the feed point, the first radiator, the second radiator, and the third radiator jointly generate at least one resonance.

According to the technical solution in this embodiment of this application, the feed point, the ground point, and the radiator are used as a part of an antenna structure of the electronic device. The feed point is disposed on a position that deviates from the central region, so that both a CM mode and a DM mode of the antenna structure can be excited. In addition, a parameter of the antenna structure is adjusted, so that a resonant frequency band generated in a multi-order resonance mode (for example, a half wavelength mode or a three-half wavelength mode) in the CM mode and a resonant frequency band generated in a multi-order resonance mode (for example, a half wavelength mode or a three-half wavelength mode) in the DM mode are close to each other, and a bandwidth of the antenna structure is expanded by using adjacent resonant frequency bands generated in a plurality of resonance modes.

In one embodiment, the second radiator and the third radiator have a same length.

In one embodiment, the first gap and the second gap have a same width.

According to the technical solution in this embodiment of this application, as symmetry of a radiator increases, a radiation characteristic (for example, a bandwidth or a gain) of the antenna structure increases accordingly.

In one embodiment, neither a feed point nor a ground point is disposed on the second radiator and the third radiator.

According to the technical solution in this embodiment of this application, neither a feed point nor a ground point may be disposed on the second radiator and the third radiator, so that a structure of the antenna structure is simpler. This facilitates a layout in the electronic device.

In one embodiment, when an electrical signal is fed at the feed point, the first radiator, the second radiator, and the third radiator jointly generate a first resonance, a second resonance, a third resonance, and a fourth resonance.

According to the technical solution in this embodiment of this application, when an electrical signal is fed at the feed point, the first radiator, the second radiator, and the third radiator jointly generate a first resonance (the half wavelength mode in the CM mode), a second resonance (the half wavelength mode in the DM mode), a third resonance (the three-half wavelength mode in the CM mode), and a fourth resonance (the three-half wavelength mode in the DM mode).

In one embodiment, resonant frequency bands of any two adjacent resonances of the first resonance, the second resonance, the third resonance, and the fourth resonance partially overlap.

According to the technical solution in this embodiment of this application, the antenna structure may expand an operating bandwidth of the antenna structure by using a plurality of resonant frequency bands that are close to each other. That resonant frequency bands of adjacent resonances partially overlap may be understood as that, for example, a resonant frequency band of the first resonance and a resonant frequency band of the second resonance are adjacent or close resonant frequency bands. In an embodiment, the resonant frequency band may be understood as a resonance frequency range in which S11 is less than −4 dB. That resonant frequency bands partially overlap may be understood as that some frequencies overlap in two resonance frequency ranges in which S11 is less than −4 dB. For example, a resonant frequency band of the first resonance includes B35 (1.85 GHZ to 1.91 GHZ) in LTE, and a resonant frequency band of the second resonance includes B39 (1.88 GHZ to 1.92 GHZ) in LTE. A frequency of the second resonance is lower than a frequency of the third resonance, and a resonant frequency band of the second resonance and a resonant frequency band of the third resonance partially overlap.

In one embodiment, the radiator further includes a fourth radiator and a fifth radiator, where a first end of the fourth radiator and a second end of the second radiator are opposite to each other, and form a third gap, and a first end of the fifth radiator and a second end of the third radiator are opposite to each other, and form a fourth gap.

According to the technical solution in this embodiment of this application, the third gap formed by using the fourth radiator and the second radiator, and the fourth gap formed by using the fifth radiator and the third radiator can further increase a higher-order resonance mode (the higher-order resonance mode and the original resonance mode are close to each other) generated by the antenna structure, for example, a five-half wavelength mode in the CM mode and a five-half wavelength mode in the DM mode, and can further expand an operating bandwidth of the antenna structure. It should be understood that the radiator of the antenna structure may include a plurality of radiators, and is not limited to the three radiators or the five radiators provided in embodiments of this application. Adjustment may be performed based on an actual production or design requirement. This is not limited in this application.

In one embodiment, when an electrical signal is fed at the feed point, the first radiator, the second radiator, the third radiator, the fourth radiator, and the fifth radiator jointly generate the at least one resonance.

In one embodiment, when an electrical signal is fed at the feed point, the first radiator, the second radiator, the third radiator, the fourth radiator, and the fifth radiator jointly generate a first resonance, a second resonance, a third resonance, a fourth resonance, a fifth resonance, and a sixth resonance.

According to the technical solution in this embodiment of this application, when an electrical signal is fed at the feed point, the first radiator, the second radiator, the third radiator, the fourth radiator, and the fifth radiator jointly generate a first resonance (the half wavelength mode in the CM mode), a second resonance (the half wavelength mode in the DM mode), a third resonance (the three-half wavelength mode in the CM mode), a fourth resonance (the three-half wavelength mode in the DM mode), a fifth resonance (the five-half wavelength mode in the CM mode), and a sixth resonance (the five-half wavelength mode in the DM mode).

In one embodiment, resonant frequency bands of any two adjacent resonances of the first resonance, the second resonance, the third resonance, the fourth resonance, the fifth resonance, and the sixth resonance partially overlap.

According to the technical solution in this embodiment of this application, the antenna structure may expand an operating bandwidth of the antenna structure by using a plurality of resonant frequency bands that are close to each other.

In one embodiment, the electronic device further includes a frame, and a part of the frame has a first position, a second position, a third position, and a fourth position in sequence. A part of the frame between the first position and the second position is used as the second radiator. A part of the frame between the second position and the third position is used as the first radiator. A part of the frame between the third position and the fourth position is used as the third radiator. The first gap is provided at the second position of the frame. The second gap is provided at the third position of the frame.

According to the technical solution in this embodiment of this application, the antenna structure may include a frame antenna, and a plurality of frame segments may be used as a plurality of radiators of the antenna structure, for example, the first radiator, the second radiator, and the third radiator, to form the first gap and the second gap.

In one embodiment, the electronic device further includes a printed circuit board (PCB); and a first medium is disposed between the PCB and the first radiator, the second radiator, and the third radiator.

According to the technical solution in this embodiment of this application, the first medium may be disposed between the radiator (for example, the first radiator, the second radiator, and the third radiator) of the antenna structure and the PCB. For example, in an embodiment, the first medium may be FR-4, to enhance mechanical strength of a radiation part of the antenna structure. In addition, as a dielectric constant of the first medium increases, when an electrical length of the radiator of the antenna structure remains unchanged, a length (a physical length) of the radiation part may be further reduced, thereby reducing a volume occupied by the radiator of the antenna structure.

In one embodiment, the electronic device further includes a printed circuit board PCB, where the PCB includes a first dielectric board and a second dielectric board that are disposed in a stacked manner. The first radiator is disposed between the first dielectric board and the second dielectric board, the second radiator is disposed on an upper surface of the first dielectric board, and the third radiator is disposed on a lower surface of the second dielectric board. A projection of the first end of the first radiator and a projection of the first end of the second radiator in a first direction at least partially overlap, and form the first gap. The first direction is a direction perpendicular to a plane on which the first dielectric board or the second dielectric board is located. A projection of the second end of the first radiator and a projection of the first end of the third radiator in the first direction at least partially overlap, and form the second gap.

According to the technical solution in this embodiment of this application, the antenna structure may include a PCB antenna, and the first gap and the second gap may be formed by using a stacked structure of a plurality of dielectric boards in the PCB.

In one embodiment, a second medium is disposed in the first gap or the second gap.

According to the technical solution in this embodiment of this application, a capacitance value of the first gap or the second gap may be changed in the following manners, to control energy coupled by the first radiator to the second radiator and the third radiator. (1) The second medium is disposed in the first gap and the second gap. (2) Widths of the first gap 140 and the second gap 150 are adjusted. (3) An overlap area of the radiators on two sides of the first gap and the second gap is adjusted. Alternatively, in an embodiment, a capacitor may be disposed in each of the first gap and the second gap, and two ends of the capacitor are electrically connected to radiators on two sides of the gap, to change a capacitance value of each of the first gap and the second gap.

In one embodiment, the electronic device further includes a ground element, one end of the ground element is electrically connected to the first radiator at the ground point, and the other end of the ground element is grounded.

According to the technical solution in this embodiment of this application, the ground element may be used as a part of the antenna structure. The ground element is connected to the ground point in series, so that an electrical characteristic at the ground point changes. The change of the electrical characteristic at the ground point causes a change of a resonant frequency band in the CM mode. However, for the DM mode, a joint between the ground element and the first radiator is not a current zero point, and is not interfered by the change of the electrical characteristic at the ground point.

In one embodiment, the ground element is a capacitor.

According to the technical solution in this embodiment of this application, the ground element may be at least one of a capacitor or an inductor. When the ground element is a capacitor, a capacitance value of the capacitor may range from 0.1 pF to 100 pF, and the capacitance value of the capacitor may be adjusted based on actual production or design. Alternatively, the ground element may be an impedance network including a plurality of electronic elements. This is not limited in this application.

In one embodiment, the electronic device further includes a matching network and a feed unit, one end of the matching network is electrically connected to the first radiator at the feed point, and the other end of the matching network is electrically connected to the feed unit.

According to the technical solution in this embodiment of this application, the matching network and the feed unit may be used as a part of the antenna structure. The matching network may be configured to match an electrical signal in the feed unit with an impedance characteristic of a radiation part of the antenna structure, to minimize a transmission loss and distortion of the electrical signal, and improve a radiation characteristic of the antenna structure.

DESCRIPTION OF EMBODIMENTS

Figure 1:
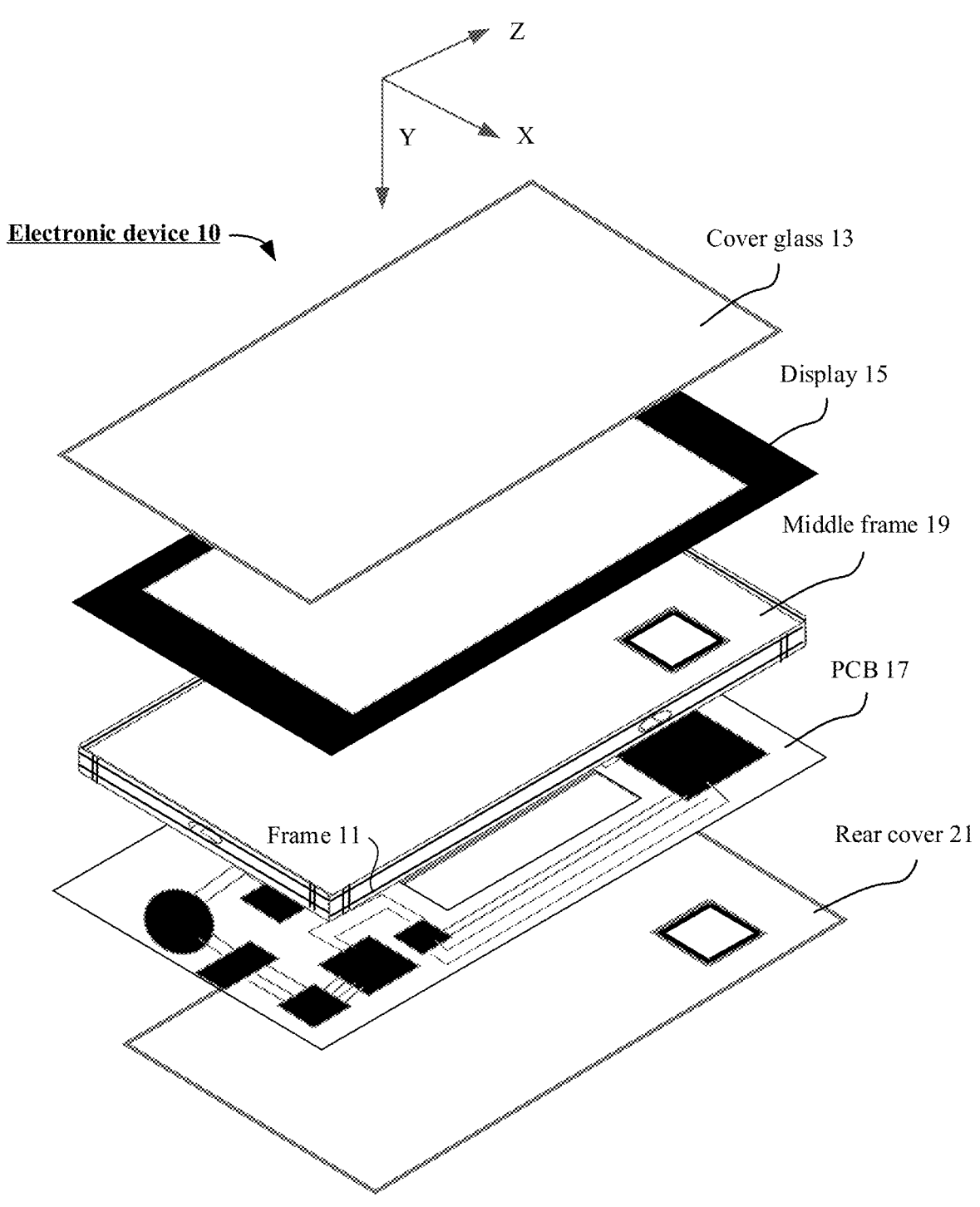
FIG. 1 is a schematic diagram of an electronic device according to an embodiment of this application.

The following describes terms that may appear in embodiments of this application.

Coupling: The coupling may be understood as direct coupling and/or indirect coupling, and a "coupling connection" may be understood as a direct coupling connection and/or an indirect coupling connection. Direct coupling may also be referred to as an "electrical connection", which may be understood as physical contact and electrical conduction of components, or may be understood as a form of connection between different components in a line structure through a physical line that can transmit an electrical signal, like a printed circuit board (printed circuit board, PCB) copper foil, or a conducting wire. "Indirect coupling" may be understood as electrical conduction of two conductors in a mid-air or non-contact manner. In an embodiment, the indirect coupling may also be referred to as capacitive coupling. For example, signal transmission is implemented by forming an equivalent capacitor through coupling in a gap between two spaced conductive members.

Connection/Interconnection: The connection/Interconnection may refer to a mechanical connection relationship or a physical connection relationship. For example, an A-B connection or A-B interconnection may mean that a fastening component (like a screw, a bolt, a rivet) exists between A and B, or that A and B are in contact with each other and are difficult to be separated.

Turn-on: Two or more components are conducted or connected in the foregoing "electrical connection" or "indirect coupling" manner to perform signal/energy transmission, which may be referred to as turn-on.

Opposite/Disposed opposite to each other: That A is disposed opposite to B may mean that A and B are disposed opposite to each other, or face to face (opposite to, or face to face).

Capacitor: The capacitor may be understood as a lumped capacitor and/or a distributed capacitor. The lumped capacitor is a capacitive type element, for example, a capacitive element. The distributed capacitor (or a distributed type capacitor) is an equivalent capacitor formed by two conductive members that are spaced by a specific gap.

Resonance/Resonance frequency: The resonance frequency is also called a resonant frequency: The resonance frequency may be a frequency at which an imaginary part of an input impedance of an antenna is zero. The resonance frequency may have a frequency range, namely, a frequency range in which a resonance occurs. A frequency corresponding to a strongest resonance point is a center frequency, namely, a point frequency. A return loss characteristic of the center frequency may be less than −20 dB.

Resonant frequency band/Communication frequency band/Operating frequency band: Regardless of a type of antenna, the antenna always operates in a specific frequency range (frequency band width). For example, an operating frequency band of an antenna that supports a B40 frequency band includes a frequency in a range of 2300 MHZ to 2400 MHZ, or in other words, an operating frequency band of the antenna includes a B40 frequency band. A frequency range that meets indicator requirements can be considered as an operating frequency band of the antenna.

Electrical length: The electrical length may be indicated by a product of a physical length (namely, a mechanical length or a geometric length) and a ratio of transmission time of an electrical or electromagnetic signal in a medium to time required when the signal passes through a distance the same as the physical length of the medium in free space, and the electrical length may satisfy the following formula:

$$\overline{L} = L \times \frac{a}{b},$$

where

L is the physical length, a is the transmission time of the electrical or electromagnetic signal in the medium, and b is the transmission time in free space.

Alternatively, the electrical length may be a ratio of a physical length (namely, a mechanical length or a geometric length) to a wavelength of a transmitted electromagnetic wave. The electrical length may satisfy the following formula:

$$\overline{L} = \frac{L}{\lambda},$$

where

L is the physical length, and λ is the wavelength of the electromagnetic wave.

In some embodiments of this application, a physical length of a radiator may be understood as an electrical length of the radiator ±10%.

In embodiments of this application, a wavelength in a wavelength mode (for example, a half wavelength mode) of the antenna may be a wavelength of a signal radiated by the antenna. For example, a resonance of a 1.575 GHz frequency band may be generated in a half wavelength mode of a floating metal antenna, where a wavelength in the half wavelength mode is a wavelength of a signal radiated by the antenna in the 1.575 GHz frequency band. It should be understood that a wavelength of the radiated signal in the air may be calculated as follows: Wavelength=Speed of light/Frequency, where the frequency is a frequency of the radiated signal. A wavelength of the radiated signal in a medium may be calculated as follows: Wavelength=(Speed of light/√ε)/Frequency, where E is a relative dielectric constant of the medium, and the frequency is a frequency of the radiated signal. The gap and the slot in the foregoing embodiments may be filled with an insulation medium.

Wavelength: The wavelength or an operating wavelength may be a wavelength corresponding to a center frequency of a resonance frequency or a center frequency of an operating frequency band supported by an antenna. For example, it is assumed that a center frequency of a B1 uplink frequency band (a resonance frequency ranges from 1920 MHz to 1980 MHZ) is 1955 MHz, the operating wavelength may be a wavelength calculated by using the frequency of 1955 MHz. The "operating wavelength" is not limited to the center frequency, and may also refer to a wavelength corresponding to a resonance frequency or a non-center frequency of the operating frequency band.

Limitations related to a position and a distance, such as being in the middle or at a middle position, mentioned in embodiments of this application are all for a current process level, and are not absolutely-strict definitions in mathematics. For example, the middle (position) of a conductor may be a conductor part including a midpoint on the conductor, or may be a conductor part that is of a one-eight wavelength and that includes a midpoint of the conductor, where the wavelength may be a wavelength corresponding to an operating frequency band of the antenna, or may be a wavelength corresponding to a center frequency of the operating frequency band, or may be a wavelength corresponding to a resonance point. For another example, the middle (position) of the conductor may be a conductor part that is on the conductor and that has a distance of less than a predetermined threshold (for example, 1 mm, 2 mm, or 2.5 mm) from the midpoint.

Such limitations as collinearity, coaxiality, coplanarity, symmetry (for example, axisymmetricity or centrosymmetricity), parallelism, perpendicularity, and sameness (for example, a same length and a same width) mentioned in embodiments of this application are all for a current process level, and are not absolutely-strict definitions in mathematics. A deviation less than a predetermined threshold (for example, 1 mm, 0.5 m, or 0.1 mm) may exist in a horizontal direction between edges of two collinear radiation stubs or two collinear antenna units. A deviation less than a predetermined threshold (for example, 1 mm, 0.5 m, or 0.1 mm) may exist between edges of two coplanar radiation stubs or two coplanar antenna units in a direction perpendicular to a plane on which the two coplanar radiation stubs or two coplanar antenna units are located. A deviation of a predetermined angle (for example, ±5° or ±10°) may exist between two antenna units that are parallel to each other. As long as the deviation is within the foregoing deviation range, the radiation stubs or antenna units may be considered as being collinear or parallel.

Co-directional/reverse distribution of currents mentioned in embodiments of this application should be understood as that directions of main currents on conductors on a same side are co-directional/reverse. For example, when co-directionally distributed currents are excited on an annular conductor (for example, a current path is also annular), it should be understood that although main currents excited on conductors on two sides of the annular conductor (for example, on conductors around a gap, or on conductors on two sides of a gap) are in reverse directions, the main currents still meet a definition of the co-directionally distributed currents in this application. Antenna total efficiency (total efficiency): The antenna total efficiency is a ratio of an input power to an output power at an antenna port.

Antenna radiation efficiency (radiation efficiency): The antenna radiation efficiency is a ratio of a power radiated by the antenna to space (namely, a power that is effectively converted into an electromagnetic wave) to an active power input to the antenna. The active power input to the antenna is equal to an input power of the antenna minus a loss power, where the loss power mainly includes a return loss power and an Ohmic loss power of metal and/or a dielectric loss power. Radiation efficiency is a value used to measure a radiation capability of an antenna. Both a metal loss and a dielectric loss are the factors that affect the radiation efficiency.

A person skilled in the art may understand that efficiency is generally indicated by a percentage, and there is a corresponding conversion relationship between the efficiency and dB. Efficiency closer to 0 dB indicates better efficiency of the antenna.

Antenna return loss: The antenna return loss may be understood as a ratio of a power of a signal reflected back to an antenna port by an antenna circuit to a transmit power of the antenna port. A smaller reflected signal indicates a larger signal radiated to space through the antenna and indicates higher radiation efficiency of the antenna. A larger reflected signal indicates a smaller signal radiated to the space through the antenna and indicates lower radiation efficiency of the antenna.

The antenna return loss may be indicated by using an S11 parameter, and S11 is one of S parameters. S11 indicates a reflection coefficient, and this parameter can indicate a level of transmit efficiency of the antenna. The S11 parameter is usually a negative number. A smaller S11 parameter indicates a smaller antenna return loss and less energy reflected by the antenna. In other words, a smaller S11 parameter indicates more energy that actually enters the antenna and higher antenna total efficiency. A larger S11 parameter indicates a larger antenna return loss and lower antenna total efficiency.

It should be noted that, in engineering, an S11 value of −4 dB is generally used as a standard. When an S11 value of the antenna is less than −4 dB, it may be considered that the antenna can operate normally, or it may be considered that transmit efficiency of the antenna is good.

Specific absorption rate (SAR): The specific absorption rate is a unit indicating how much radio frequency radiation energy is actually absorbed by a human body, is referred to as a special absorption rate, and is measured in watts/kilogram (W/kg) or milliwatts/kilogram (mW/g). The SAR is accurately defined a time derivative of unit energy (dw) absorbed by unit mass (dm) in a volume unit (dv) of a given mass density (ρ-body tissue density).

Ground (ground): The ground (ground) may generally refer to at least a part of any ground plane, or ground plate, or ground metal layer in an electronic device (like a mobile phone), or at least a part of any combination of any ground plane, or ground plate, or ground part. The "ground" may be used to ground a component in the electronic device. In an embodiment, the "ground" may be a ground plane of a circuit board of the electronic device, or may be a ground metal layer formed by a ground plate formed using a middle frame of the electronic device or a metal thin film below a screen in the electronic device. In an embodiment, the circuit board may be a printed circuit board (printed circuit board. PCB), for example, an 8-layer, 10-layer, or 12-layer to 14-layer board having 8, 10, 12, 13, or 14 layers of conductive materials, or an element that is separated by a dielectric layer or an insulation layer like glass fiber or polymer and that is electrically insulated. In an embodiment, the circuit board includes a dielectric substrate, a ground plane, and a wiring layer. The wiring layer and the ground plane are electrically connected through a via. In an embodiment, parts such as a display: a touchscreen, an input button, a transmitter, a processor, a memory, a battery, a charging circuit, and a system on chip (system on chip, SoC) structure may be installed on or connected to the circuit board, or may be electrically connected to the wiring layer and/or the ground plane in the circuit board. For example, a radio frequency source is disposed at the wiring layer.

Any of the foregoing ground plane, or ground plate, or ground metal layer is made of a conductive material. In an embodiment, the conductive material may be any one of the following materials: copper, aluminum, stainless steel, brass and alloys thereof, copper foils on insulation laminates, aluminum foils on insulation laminates, gold foils on insulation laminates, silver-plated copper, silver-plated copper foils on insulation laminates, silver foils on insulation laminates and tin-plated copper, cloth impregnated with graphite powder, graphite-coated laminates, copper-plated laminates, brass-plated laminates, and aluminum-plated laminates. A person skilled in the art may understand that the ground plane/ground plate/ground metal layer may alternatively be made of another conductive material.

The technical solutions provided in embodiments of this application are applicable to an electronic device that uses one or more of the following communication technologies: a Bluetooth (BT) communication technology, a global positioning system (GPS) communication technology, a wireless fidelity (Wi-Fi) communication technology, a global system for mobile communications (GSM) communication technology, a wideband code division multiple access (WCDMA) communication technology, a long term evolution (LTE) communication technology, a 5G communication technology, and other future communication technologies. The electronic device in embodiments of this application may be a mobile phone, a tablet computer, a notebook computer, a smart household, a smart band, a smart watch, a smart helmet, smart glasses, or the like. The electronic device may be alternatively a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, an electronic device in a 5G network, an electronic device in a future evolved public land mobile network (PLMN), or the like. This is not limited in embodiments of this application. FIG. 1 shows an example of an electronic device provided in an embodiment of this application. An example in which the electronic device is a mobile phone is used for description.

The following describes technical solutions of embodiments in this application with reference to accompanying drawings.

As shown in FIG. 1, an electronic device 10 may include a cover 13, a display/module (display) 15, a printed circuit board (PCB) 17, a middle frame 19, and a rear cover 21. It should be understood that, in some embodiments, the cover 13 may be a cover glass, or may be replaced with a cover of another material, for example, a cover of an ultra-thin glass material or a cover of a polyethylene terephthalate (PET) (Polyethylene terephthalate, polyethylene terephthalate) material.

The cover 13 may be tightly attached to the display module 15, and may be mainly used to protect the display module 15 for dust resistance.

In an embodiment, the display module 15 may include a liquid crystal display panel (LCD), a light-emitting diode (LED) display panel, an organic light-emitting diode (OLED) display panel, or the like. This is not limited in this application.

The middle frame 19 is mainly used to support the electronic device. FIG. 1 shows that the PCB 17 is disposed between the middle frame 19 and the rear cover 21. It should be understood that, in an embodiment, the PCB 17 may alternatively be disposed between the middle frame 19 and the display module 15. This is not limited in this application. The printed circuit board PCB 17 may be a flame-resistant material (FR-4) dielectric board, or may be a Rogers (Rogers) dielectric board, or may be a hybrid dielectric board of Rogers and FR-4, or the like. Herein. FR-4 is a grade designation for a flame-resistant material, and the Rogers dielectric board is a high-frequency board. An electronic element, for example, a radio frequency chip, is carried on the PCB 17. In an embodiment, a metal layer may be disposed on the printed circuit board PCB 17. The metal layer may be used to ground the electronic element carried on the printed circuit board PCB 17, or may be used to ground another element, for example, a support antenna or a frame antenna. The metal layer may be referred to as a ground, a ground plate, or a ground plane. In an embodiment, the metal layer may be formed by etching metal on a surface of any dielectric board in the PCB 17. In an embodiment, the metal layer used for grounding may be disposed on a side that is of the printed circuit board PCB 17 and that is close to the middle frame 19. In an embodiment, an edge of the printed circuit board PCB 17 may be considered as an edge of a ground plane of the printed circuit board PCB 17. In an embodiment, the metal middle frame 19 may also be configured to ground the foregoing element. The electronic device 10 may further have another ground/ ground plate/ground plane, as described above. Details are not described herein again.

The electronic device 10 may further include a battery (not shown in the figure). The battery may be disposed between the middle frame 19 and the rear cover 21, or may be disposed between the middle frame 19 and the display module 15. This is not limited in this application. In some embodiments, the PCB 17 is divided into a mainboard and a sub-board. The battery may be disposed between the mainboard and the sub-board. The mainboard may be disposed between the middle frame 19 and an upper edge of the battery, and the sub-board may be disposed between the middle frame 19 and a lower edge of the battery.

The electronic device 10 may further include a frame 11, and the frame 11 may be made of a conductive material like metal. The frame 11 may be disposed between the display module 15 and the rear cover 21, and extend around a periphery of the electronic device 10. The frame 11 may have four sides surrounding the display module 15, to help fasten the display module 15. In an implementation, the frame 11 made of a metal material may be directly used as a metal frame of the electronic device 10 to form an appearance of the metal frame, and is applicable to a metal industrial design (ID). In another implementation, an outer surface of the frame 11 may alternatively be made of a non-metal material, for example, is a plastic frame, to form an appearance of the non-metal frame, and is applicable to a non-metal ID.

The middle frame 19 may include the frame 11, and the middle frame 19 including the frame 11 is used as an integrated component, and may support an electronic component in the electronic device. The cover 13 and the rear cover 21 are respectively covered along an upper edge and a lower edge of the frame, to form a casing or a housing (housing) of the electronic device. In an embodiment, the cover 13, the rear cover 21, the frame 11, and/or the middle frame 19 may be collectively referred to as a casing or a housing of the electronic device 10. It should be understood that the "casing or housing" may be used to refer to a part or all of any one of the cover 13, the rear cover 21, the frame 11, or the middle frame 19, or refer to a part or all of any combination of the cover 13, the rear cover 21, the frame 11, or the middle frame 19.

Alternatively, the frame 11 may not be considered as a part of the middle frame 19. In an embodiment, the frame 11 and the middle frame 19 may be connected and integrally formed. In another embodiment, the frame 11 may include a protruding part extending inwards, to be connected to the middle frame 19 by welding, using a spring or a screw: or the like. The protruding part of the frame 11 may be further configured to receive a feed signal, so that at least a part of the frame 11 is used as a radiator of the antenna to receive/ transmit a radio frequency signal. A gap 42 may exist between the frame part that serves as the radiator and the middle frame 30, to ensure that the radiator of the antenna has a good radiation environment, and the antenna has a good signal transmission function.

The rear cover 21 may be a rear cover made of a metal material, or may be a rear cover made of a non-conductive material, for example, a glass rear cover, a plastic rear cover, or another non-metallic rear cover.

FIG. 1 shows only an example of some parts included in the electronic device 10. Actual shapes, actual sizes, and actual structures of these parts are not limited to those in FIG. 1.

It should be understood that, in embodiments of this application, it may be considered that a surface on which the display of the electronic device is located is a front surface, a surface on which the rear cover is located is a rear surface, and a surface on which the frame is located is a side surface.

It should be understood that, in embodiments of this application, it is considered that when a user holds the electronic device (the user usually holds the electronic device vertically and faces the screen), a position in which the electronic device is located has a top part, a bottom part, a left part, and a right part.

Figure 2:
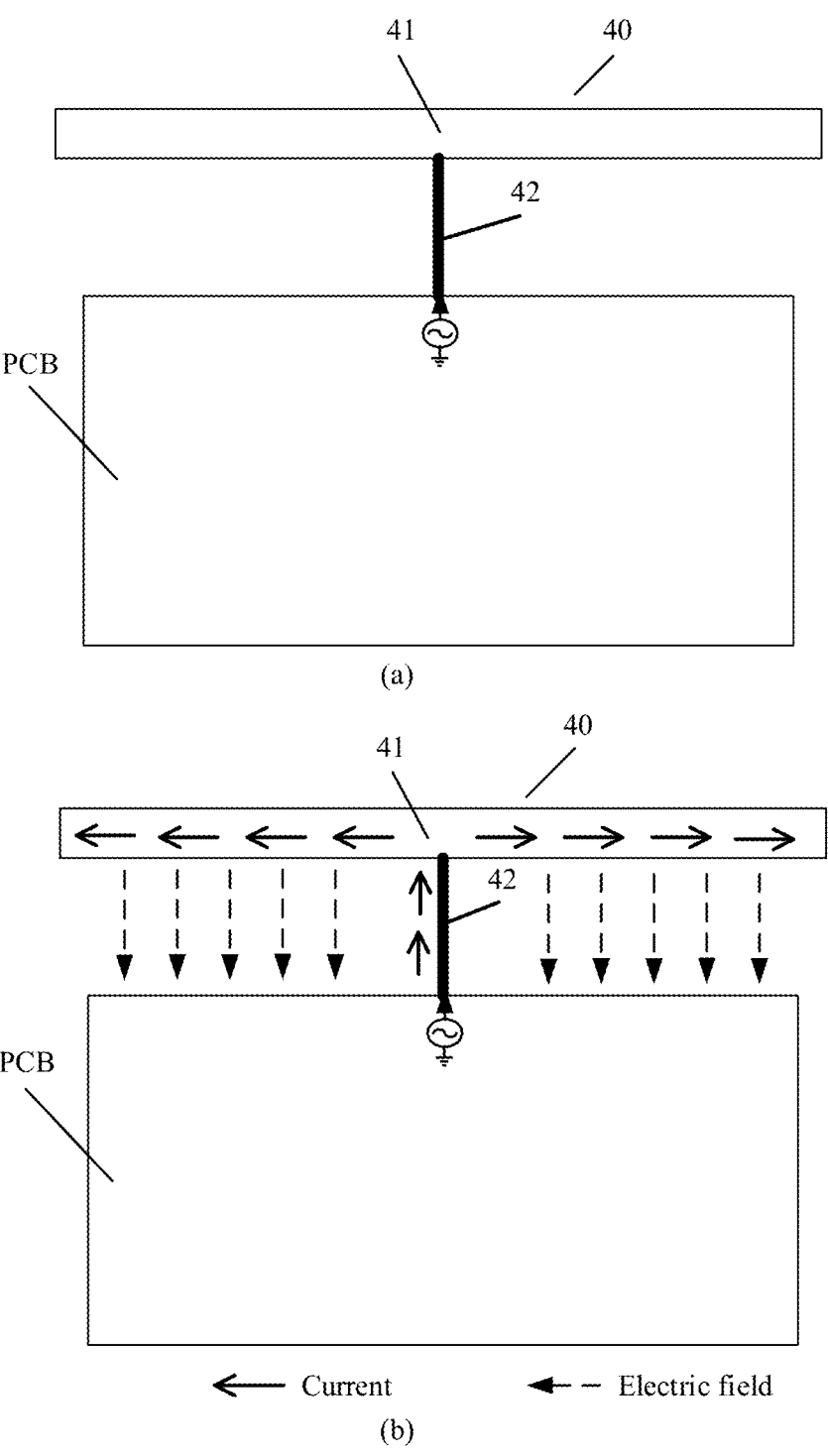
FIG. 2 shows schematic diagrams of a common-mode structure of a wire antenna and distribution of corresponding currents and electric fields according to this application.
Figure 3:
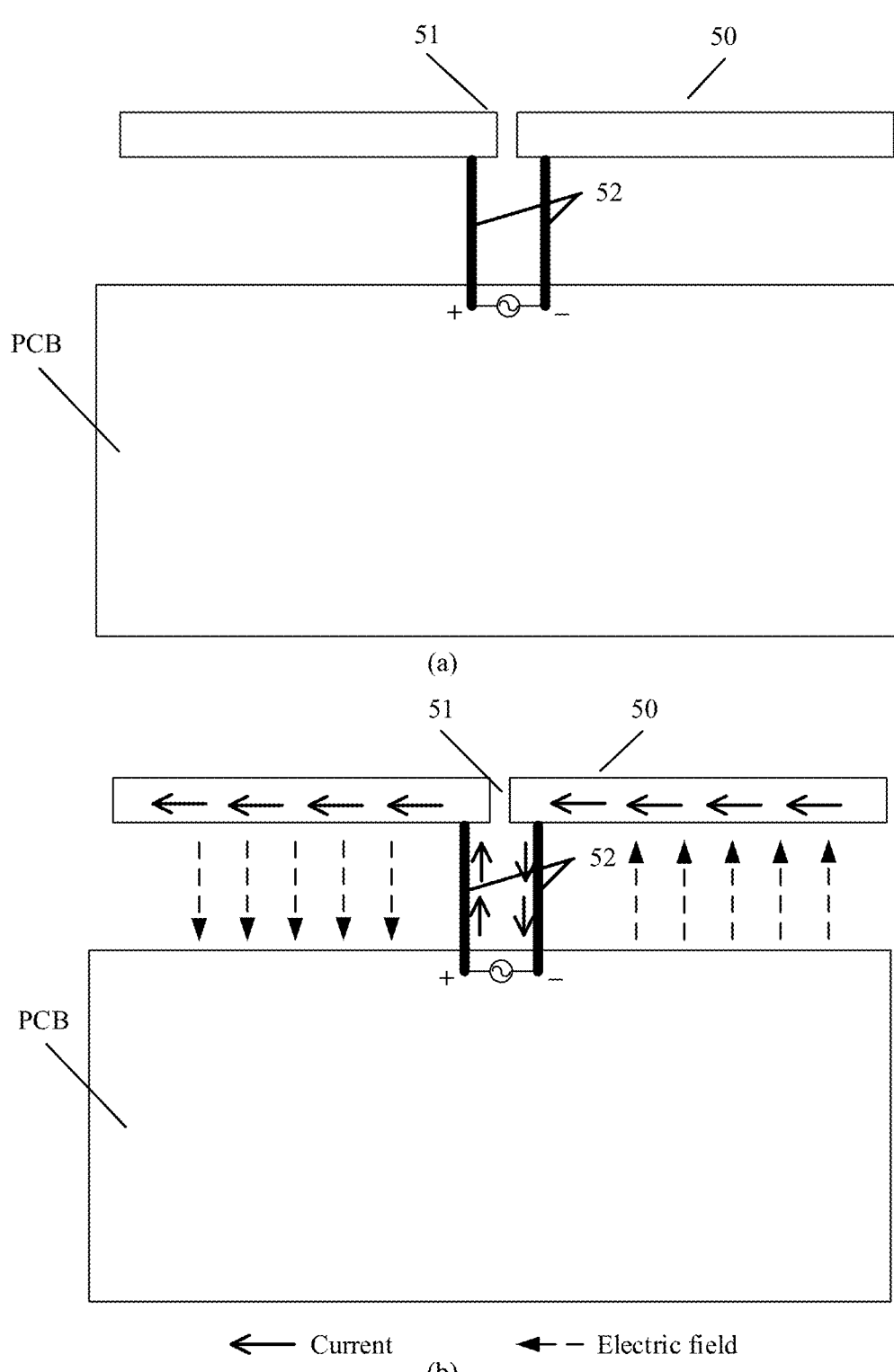
FIG. 3 shows schematic diagrams of a differential-mode structure of a wire antenna and distribution of corresponding currents and electric fields according to this application.

First, four antenna modes in embodiments of this application are described by using FIG. 2 and FIG. 3. FIG. 2 shows schematic diagrams of a common-mode structure of a wire antenna and distribution of corresponding currents and electric fields according to an embodiment of this application. FIG. 3 shows schematic diagrams of a differential-mode structure of another wire antenna and distribution of corresponding currents and electric fields according to an embodiment of this application.

1. Common Mode (CM) Mode of a Wire Antenna

Herein, (a) in FIG. 2 shows a case in which a radiator of a wire antenna 40 is grounded (for example, connected to a ground, which may be a PCB) through a feed line 42. The wire antenna 40) is connected to a feed unit (not shown in the figure) at a middle position 41, and uses symmetrical feed (symmetrical feed). The feed unit may be connected to the middle position 41 of the wire antenna 40 through the feed line 42. It should be understood that the symmetrical feed may be understood as that one end of the feed unit is connected to the radiator and the other end of the feed unit is grounded. A connection point (feed point) between the feed unit and the radiator is located in a center of the radiator, and the center of the radiator may be, for example, a midpoint of a collective structure, or a midpoint of an electrical length (or a region within a specific range near the midpoint).

The middle position 41 of the wire antenna 40, for example, the middle position 41, may be a geometric center of the wire antenna, or the midpoint of the electrical length of the radiator, for example, a joint between the feed line 42 and the wire antenna 40) covers the middle position 41.

Herein, (b) in FIG. 2 shows distribution of currents and electric fields of the wire antenna 40. As shown in (b) in FIG. 2, the currents are symmetrically distributed on two sides of the middle position 41, for example, are reversely distributed. The electric fields are co-directionally distributed on two sides of the middle position 41. As shown in (b) in FIG. 2, the currents at the feed line 42 are co-directionally distributed. Based on the co-directional distribution of the currents at the feed line 42, such feed as shown in (a) in FIG. 2 may be referred to as CM feed of the wire antenna. Based on the symmetrical distribution of the currents on two sides of a joint between the radiator and the feed line 42, the wire antenna mode shown in (b) in FIG. 2 may be referred to as a CM mode of the wire antenna (or may be referred to as a CM wire antenna for short). The currents and electric fields shown in (b) in FIG. 2 may be respectively referred to as currents and electric fields in the CM mode of the wire antenna.

The currents and electric fields in the CM mode of the wire antenna are generated by two stubs (for example, two horizontal stubs) on two sides of the middle position 41 of the wire antenna 40) as an antenna operating in a quarter-wavelength mode. The current is strong at the middle position 41 of the wire antenna 40 and weak at two ends of the wire antenna 40. The electric field is weak at the middle position 41 of the wire antenna 40 and strong at two ends of the wire antenna 40.

2. Differential Mode (DM) Mode of a Wire Antenna

Herein, (a) in FIG. 3 shows a case in which two radiators of a wire antenna 50 are grounded (for example, connected to a ground, which may be a PCB) through a feed line 52. The wire antenna 50 is connected to a feed unit at a middle position 51 between the two radiators and uses anti-symmetrical feed (anti-symmetrical feed). One end of the feed unit is connected to one of the radiators through the feed line 52, and the other end of the feed unit is connected to the other of the radiators through the feed line 52. The middle position 51 may be a geometric center of the wire antenna, or a gap between the radiators.

It should be understood that the anti-symmetrical feed may be understood as that positive and negative electrodes of the feed unit are respectively connected to two ends of the radiator. Signals output from the positive and negative electrodes of the feed unit have a same amplitude but opposite phases, for example, a phase difference is 180°±10°.

Herein. (b) in FIG. 3 shows distribution of currents and electric fields of the wire antenna 50. As shown in (b) in FIG. 3, the currents are asymmetrically distributed on two sides of the middle position 51 of the wire antenna 50, for example, are co-directionally distributed. The electric fields are reversely distributed on two sides of the middle position 51. As shown in (b) in FIG. 3, the currents at the feed line 52 are reversely distributed. Based on the reverse distribution of the currents at the feed line 52, such feed as shown in (a) in FIG. 3 may be referred to as DM feed of the wire antenna. Based on the asymmetrical distribution (for example, the co-directional distribution) of the currents on two sides of a joint between the radiator and the feed line 52, the wire antenna mode shown in (b) in FIG. 3 may be referred to as a DM mode of the wire antenna (or may be referred to as a DM wire antenna for short). The currents and electric fields shown in (b) in FIG. 3 may be respectively referred to as currents and electric fields in the DM mode of the wire antenna.

The currents and electric fields in the DM mode of the wire antenna are generated by the entire wire antenna 50 as an antenna operating in a half wavelength mode. The current is strong at the middle position 51 of the wire antenna 50 and weak at two ends of the wire antenna 50. The electric field is weak at the middle position 51 of the wire antenna 50 and strong at two ends of the wire antenna 50.

It should be understood that the radiator of the wire antenna may be understood as a metal mechanical part that generates radiation, and a quantity of radiators may be one, as shown in FIG. 2, or may be two, as shown in FIG. 3, and may be adjusted based on an actual design or production requirement. For example, for the CM mode of the wire antenna, as shown in FIG. 3, two radiators may also be used, two ends of the two radiators are oppositely disposed and are spaced part by using a gap, and a symmetrical feed manner is used at two ends that are close to each other. For example, effect similar to that of the antenna structure shown in FIG. 2 may also be obtained by separately feeding a same feed signal into the two ends that of the two radiators and that are close to each other. Correspondingly, for the DM mode of the wire antenna, as shown in FIG. 2, one radiator may also be used, and two feed points are disposed in the middle position of the radiator, and an anti-symmetrical feed manner is used. For example, effect similar to that of the antenna structure shown in FIG. 3 may also be obtained by respectively feeding signals of a same amplitude and opposite phases into two symmetrical feed points on the radiator.

In a conventional antenna design in the CM mode and the DM mode, resonance frequencies of a half wavelength mode (a first-order mode), a one-time wavelength mode (a second-order mode), and a three-half wavelength mode (a third-order mode) of the antenna have a frequency multiplication relationship. For example, if a resonance frequency corresponding to the half wavelength mode is close to 1 GHZ, resonance frequencies of the one-time wavelength mode and the three-half wavelength mode (the third-order mode) are respectively close to 2 GHZ and 3 GHZ. Therefore, a bandwidth corresponding to a single resonance generated on the antenna is narrow. In addition, in a DM mode of an antenna, an efficiency pit is generated in a resonant frequency band of the antenna, and performance of the antenna is affected.

Embodiments of this application provide an electronic device, including a plurality of radiators. In an embodiment, the plurality of radiators are used as at least a part of an antenna structure of the electronic device. Gaps formed between the plurality of radiators are used to adjust a frequency of a resonant frequency band that is generated by the antenna structure in a multi-order CM mode and a frequency of a resonant frequency band that is generated by the antenna structure in a multi-order DM mode, so that the frequency of the resonant frequency band in the multi-order CM mode is close to the frequency of the resonant frequency band in the multi-order DM mode. This implements a broadband antenna and meeting requirements of a plurality of communication frequency bands.

Figure 4:
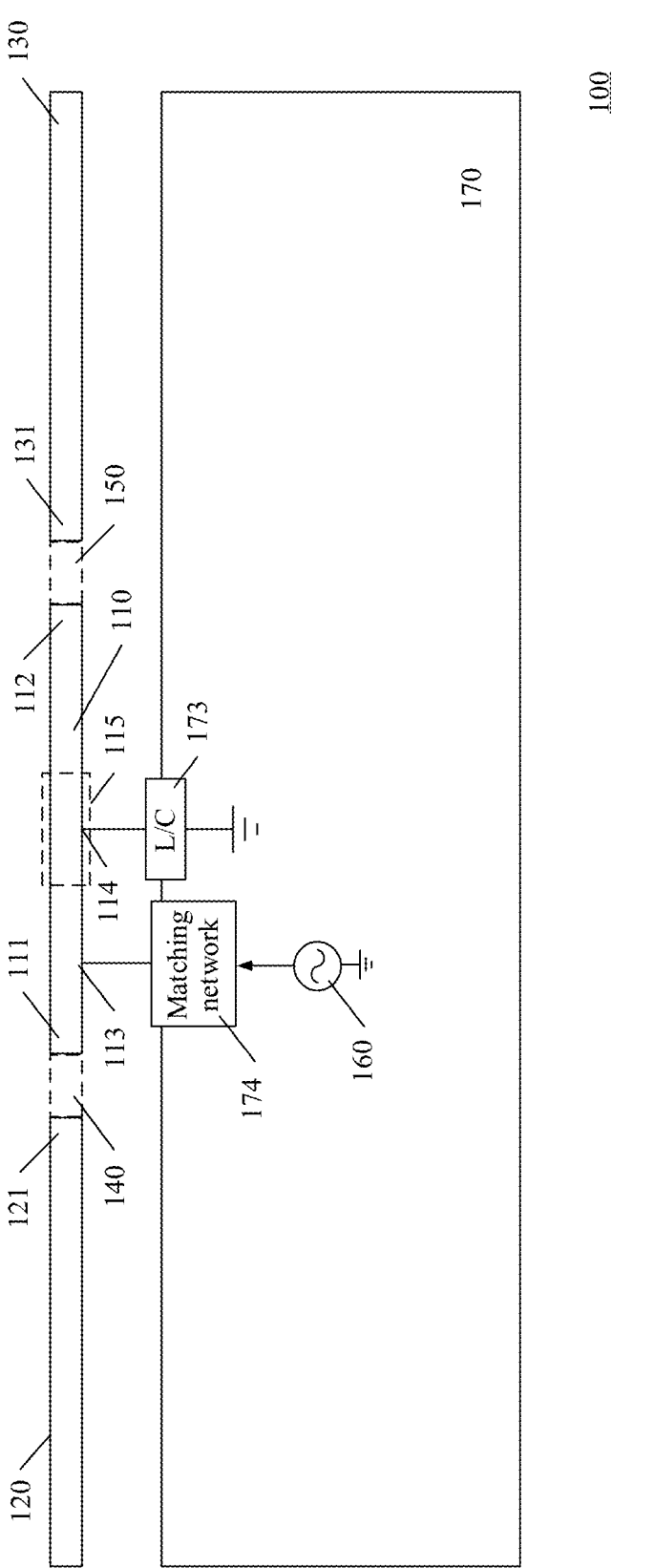
FIG. 4 is a schematic diagram of a structure of an antenna structure 100 according to an embodiment of this application.

FIG. 4 is a schematic diagram of a structure of an antenna structure 100 according to an embodiment of this application.

As shown in FIG. 4, the antenna structure 100 may include a first radiator 110, a second radiator 120, and a third radiator 130. The first radiator 110, the second radiator 120, and the third radiator 130) are used as radiators of the antenna structure 100.

The first radiator 110 may be disposed between the second radiator 120 and the third radiator 130. A first end 111 of the first radiator 110 and a first end 121 of the second radiator 120) are opposite to, but do not touch each other, and a first gap 140 is formed between the first end 111 of the first radiator 110 and the first end 121 of the second radiator 120. A second end 112 of the first radiator 110 and a first end 131 of the third radiator 130 are opposite to, but do not touch each other, and a second gap 150 is formed between the second end 112 of the first radiator 110 and the first end 131 of the third radiator 130. The first radiator 110 is provided with a feed point 113 and a ground point 114. The ground point 114 is disposed in a central region 115. The ground point 114 is electrically connected to a ground 170 for grounding the antenna structure 100. The feed point 113 is disposed between the central region 115 and the first end 111 of the first radiator 110. In an embodiment, the electronic device further includes a feed unit 160. The feed point 113 is electrically connected to the feed unit 160 for feeding the radiator. In an embodiment, the feed unit may be used as a part of the antenna structure 100. When an electrical signal is fed at the feed point, the first radiator 110, the second radiator 120, and the third radiator 130 jointly generate at least one resonance.

In the technical solution provided in embodiments of this application, the feed point 113 is disposed at a position that deviates from the central region 115, so that both a CM mode and a DM mode of the antenna structure 100 can be excited. In addition, a parameter of the antenna structure is adjusted, so that a resonant frequency band generated in a multi-order resonance mode (for example, a half wavelength mode or a three-half wavelength mode) in the CM mode and a resonant frequency band generated in a multi-order resonance mode (for example, a half wavelength mode or a three-half wavelength mode) in the DM mode are close to each other, and a bandwidth of the antenna structure 100 is expanded by using adjacent resonant frequency bands generated in a plurality of resonance modes.

The "central region" mentioned in this embodiment of this application may be understood as a region formed by a central region of a radiator at a specific distance from midpoints of all radiators of the antenna structure. The antenna structure shown in FIG. 4 is used as an example. The radiator includes the first radiator 110, the second radiator 120, and the third radiator 130. The midpoint of the radiator may be a geometric center of the radiator (the radiator has a same length on two sides of the midpoint, that is, the first radiator 110 has a length the same as a sum of a length of the second radiator 120 and a length of the third radiator 130 on two sides of the midpoint). Alternatively, the midpoint of the radiator may be a midpoint of an electrical length of the radiator (the radiator has a same electrical length on two sides of the midpoint, that is, the first radiator 110 has an electrical length the same as a sum of an electrical length of the second radiator 120 and an electrical length of the third radiator 130 on the two sides of the midpoint). For example, when the first radiator 110, the second radiator 120, and the third radiator 130 each have a first length, the central region 115 of the first radiator 110, the second radiator 120, and the third radiator 130 may be a region at a distance of one eighth of the first length from midpoints of the radiators.

Alternatively, the "central region" mentioned in this embodiment of this application may be understood as a region formed by a central region of the first radiator 110 at a specific distance from a midpoint of the first radiator 110. The antenna structure shown in FIG. 4 is used as an example. The midpoint of the first radiator 110 may be a geometric center (the first radiator 110 has a same length on two sides of the midpoint). Alternatively, the midpoint of the first radiator 110 may be a midpoint of an electrical length of the first radiator 110 (the first radiator 110 has a same electrical length on two sides of the midpoint).

In addition, according to the technical solution in this embodiment of this application, the first end 111 of the first radiator 110 cannot be understood as a point in a narrow sense, and may be considered as a radiator segment that includes an endpoint (an endpoint of the first radiator 110 may be any point on an edge of the first radiator 110) on the first radiator 110. For example, the first end 111 may be considered as a radiator at a distance within one eighth of a first wavelength from the endpoint, or may be considered as a radiator at a distance within 5 mm from the endpoint. The second end 112 of the first radiator 110, the first end 121 of the second radiator 120, and the first end 131 of the third radiator 130 may also be correspondingly understood.

In an embodiment, neither a feed point nor a ground point may be disposed on the second radiator and the third radiator, so that a structure of the antenna structure 100 is simpler. This facilitates a layout in the electronic device.

In an embodiment, when an electrical signal is fed at the feed point, the first radiator 110, the second radiator 120, and the third radiator 130 jointly generate a first resonance (the half wavelength mode in the CM mode), a second resonance (the half wavelength mode in the DM mode), a third resonance (the three-half wavelength mode in the CM mode), and a fourth resonance (the three-half wavelength mode in the DM mode).

In an embodiment, resonant frequency bands of any two adjacent resonances of the first resonance, the second resonance, the third resonance, and the fourth resonance partially overlap, to expand an operating bandwidth of the antenna structure 100. That resonant frequency bands of adjacent resonances partially overlap may be understood as that, for example, a resonant frequency band of the first resonance and a resonant frequency band of the second resonance are adjacent or close resonant frequency bands. In an embodiment, the resonant frequency band may be understood as a resonance frequency range in which S11 is less than −4 dB. That resonant frequency bands partially overlap may be understood as that some frequencies overlap in two resonance frequency ranges in which S11 is less than −4 dB. For example, a resonant frequency band of the first resonance includes B35 (1.85 GHZ to 1.91 GHZ) in LTE, and a resonant frequency band of the second resonance includes B39 (1.88 GHZ to 1.92 GHZ) in LTE. A frequency of the second resonance is lower than a frequency of the third resonance, and a resonant frequency band of the second resonance and a resonant frequency band of the third resonance partially overlap. In an embodiment, that the first gap 140 is formed between the first end 111 of the first radiator 110 and the first end 121 of the second radiator 120 may be understood as that the first radiator 110 and the second radiator 120 are disposed in a same plane (for example, are coplanar), and an end part of the first end 111 of the first radiator 110 and an end part of the first end 121 of the second radiator 120 are opposite to each other, and form the first gap 140.

Figure 5:
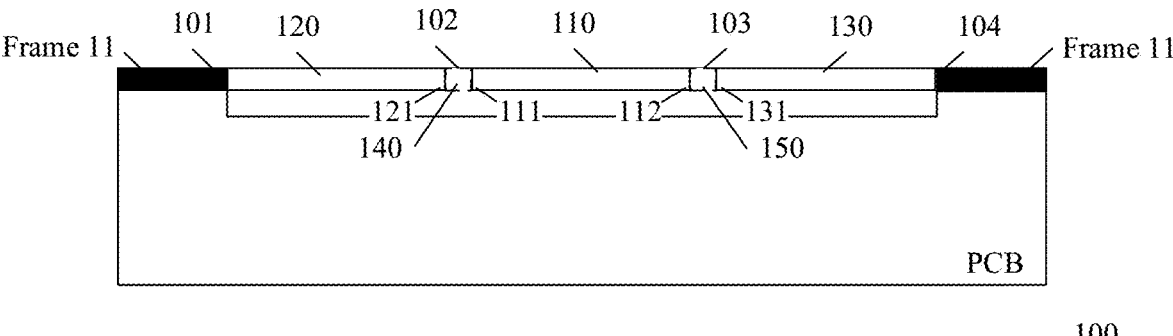
FIG. 5 is a schematic diagram of a structure of another antenna structure 100 according to an embodiment of this application.

For example, in an embodiment, the antenna structure 100 may include a frame antenna, as shown in FIG. 5. A part of the frame 11 of the electronic device has a first position 101, a second position 102, a third position 103, and a fourth position 104 in sequence. A part of the frame 11 between the first position 101 and the second position 102 is used as the second radiator 120, a part of the frame 11 between the second position 102 and the third position 103 is used as the first radiator 110, and a part of the frame 11 between the third position 103 and the fourth position 104 is used as the third radiator 130. The first gap 140 is provided at the second position 102 of the frame 11, that is, the first gap 140 is formed between an end face of the first end 111 of the first radiator 110 and an end face of the first end 121 of the second radiator 120. The second gap 150 is provided at the third position 103 of the frame 11, that is, the second gap 150 is formed between an end face of the second end 112 of the first radiator 110 and an end face of the first end 131 of the third radiator 130.

In an embodiment, the ground 170) may be a metal layer in the PCB. A first medium may be disposed between a radiator/radiation part (for example, the first radiator 110, the second radiator 120, and the third radiator 130) of the antenna structure 100 and the PCB. For example, in an embodiment, the first medium may be the FR-4 mentioned above, to enhance mechanical strength of the radiation part of the antenna structure 100. In addition, as a dielectric constant of the first medium increases, when an electrical length of the radiation part (the first radiator 110, the second radiator 120, and the third radiator 130) of the antenna structure 100 is kept unchanged, a length of the radiation part may be further decreased, and a volume occupied by the radiation part of the antenna structure 100 is reduced.

Figure 6:
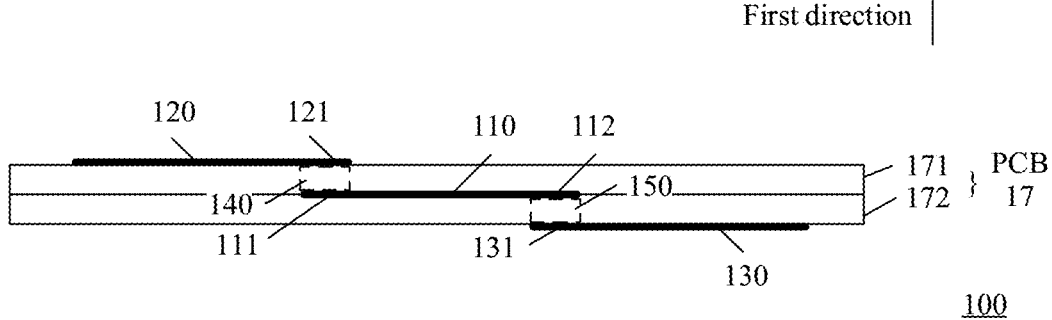
FIG. 6 is a schematic diagram of a structure of still another antenna structure 100) according to an embodiment of this application.

Alternatively, in an embodiment, the antenna structure 100 may include a PCB antenna, as shown in FIG. 6. The PCB 17 of the electronic device includes a first dielectric board 171 and a second dielectric board 172 that are disposed in a stacked manner. The first radiator 110 is disposed between the first dielectric board 171 and the second dielectric board 172, the second radiator 120 is disposed on an upper surface of the first dielectric board 171, and the third radiator 130 is disposed on a lower surface of the second dielectric board 172. A projection of the first end 111 of the first radiator 110 and a projection of the first end 121 of the second radiator 120 in a first direction at least partially overlap, and form the first gap 140 in the first direction. A projection of the second end 112 of the first radiator 110 and a projection of the first end 131 of the third radiator 130 in the first direction at least partially overlap, and form the second gap 150 in the first direction. The first direction is a direction perpendicular to a plane on which the first radiator is located.

It should be understood that the "upper surface" and the "lower surface" in embodiments of this application are merely used as examples, and "upper" and "lower" are merely used as relative concepts in space, and are not limited to specific orientations during actual application. In addition, the PCB may further include other dielectric boards that are disposed in a stacked manner. For example, the PCB includes a first dielectric board, a second dielectric board, and a third dielectric board that are sequentially disposed in a stacked manner. The second radiator may be disposed between the first dielectric board and the second dielectric board, the first radiator is disposed between the second dielectric board and the third dielectric board, and the third radiator is disposed on a lower surface of the third dielectric board. Alternatively, an adjustment may be performed based on an actual production or design requirement. This is not limited in this application.

In an embodiment, the antenna structure 100 may alternatively include another type of antenna, for example, an optically invisible display antenna (antenna on display, AOD), a support antenna, a laser-direct-structuring (laser-direct-structuring, LDS) antenna, a flexible circuit board (flexible printed circuit, FPC) antenna, or a floating metal (floating metal, FLM) antenna. A type of the antenna structure is not limited in this application. For brevity of description, details are not described again.

Figure 7:
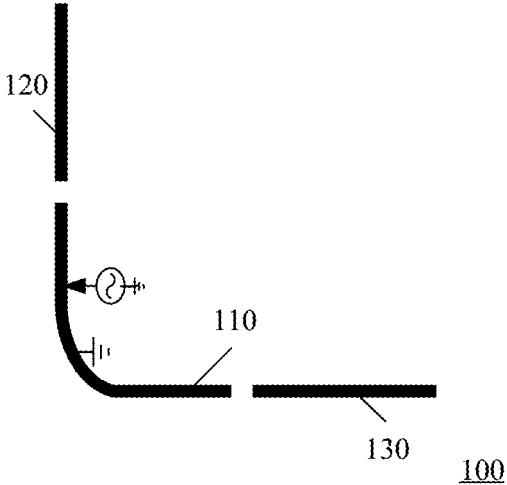
FIG. 7 is a schematic diagram of a structure of still another antenna structure 100) according to an embodiment of this application.

In addition, because space inside the electronic device becomes smaller, the first radiator 110, the second radiator 120, and the third radiator 130 may not necessarily be disposed along a straight line (for example, are collinear), and may be bent along with internal space of the electronic device. For example, when the antenna structure 100 includes a frame antenna, the first radiator 110 may be disposed in a bent manner with a frame, as shown in FIG. 7. Alternatively, the second radiator 120 and the third radiator 130 may be disposed in a bent manner. This is not limited in this application.

In an embodiment, the second radiator 120 and the third radiator 130 may have a same length. In addition, in an embodiment, the first gap 140 and the second gap 150 may have a same width. In this case, the second radiator 120 and the third radiator 130 are symmetrical along a virtual axis of the first radiator 110 (the first radiator 110 has a same length on two sides of the virtual axis). As symmetry of the radiation part of the antenna structure 100 increases, a radiation characteristic (for example, a bandwidth and a gain) of the antenna structure 100 increases accordingly. In an embodiment, during an actual application, due to a processing error or an internal layout of the electronic device, when a difference between lengths of the second radiator 120 and the third radiator 130 is within 10%, it may be understood that the second radiator 120 and the third radiator 130 have a same length. When a difference between widths of the first gap 140 and the second gap 150 is within 10%, it may be understood that the first gap 140 and the second gap 150 have a same width.

In an embodiment, by adjusting parameters of the first gap 140 and the second gap 150, energy coupled by the first radiator 110 to the second radiator 120 and the third radiator 130 may be adjusted, to control a radiation characteristic of the antenna structure 100. The first gap 140 formed by using the first end 111 of the first radiator 110 and the first end 121 of the second radiator 120 and the second gap 150 formed by using the second end 112 of the first radiator 110 and the first end 131 of the third radiator 130 may be equivalent to a capacitor. A calculation formula of a capacitance value is as follows:

$$C = \frac{\varepsilon S}{4\pi k d},$$

where

ε is a dielectric constant of a medium between two plates (radiators on two sides of a gap) of the capacitor, δ is an absolute dielectric constant in vacuum, and k is an electrostatic force constant. S is an overlap area of the two plates, and is an overlap area of side radiators on two sides of the gap in this embodiment of this application: and d is a vertical distance between the two plates, and is a width of the first gap or the second gap in this embodiment of this application.

In an embodiment, it can be learned from the foregoing formula that, the capacitance value of the first gap or the second gap may be changed in the following manner, to control energy coupled by the first radiator 110 to the second radiator 120 and the third radiator 130: (1) A second medium is disposed in the first gap 140 and the second gap 150. (2) Widths of the first gap 140 and the second gap 150 are adjusted. (3) An overlap area of the radiators on two sides of the first gap 140 and the second gap 150 is adjusted.

Alternatively, in an embodiment, a capacitor may be disposed in each of the first gap 140 and the second gap 150, and two ends of the capacitor are electrically connected to radiators on two sides of the gap, to change a capacitance value of each of the first gap 140 and the second gap 150.

It should be understood that capacitance values of the first gap 140 and the second gap 150 are related to a frequency of an operating frequency band of the antenna structure, and may be adjusted based on an actual design or production requirement. This is not limited in this application.

In an embodiment, the electronic device may further include a ground element 173. In an embodiment, the ground element 173 may be disposed between the ground point 114 and the ground 170, as shown in FIG. 4. In an embodiment, the ground element 173 may be used as a part of the antenna structure 100. One end of the ground element 173 is electrically connected to the first radiator 110 at the ground point 114, and the other end of the ground element 173 is electrically connected to the ground 170. The ground element 173 may be used to adjust a radiation characteristic of the antenna structure 100, for example, a frequency of a resonance point generated by the antenna structure 100. In an embodiment, the ground element 173 may be at least one of a capacitor or an inductor. For example, the ground element 173 may be a capacitor, and a capacitance value may range from 0.1 pF to 100 pF, for example, from 1 pF to 50 pF. The capacitance value of the capacitor may be adjusted based on actual production or design. Alternatively, the ground element 173 may be an impedance network including a plurality of electronic elements. This is not limited in this application.

In an embodiment, the electronic device further includes a matching network 174. In an embodiment, the matching network 174 may be disposed between the feed point 113 and the feed unit 160, as shown in FIG. 4. In an embodiment, the matching network 174 may be used as a part of the antenna structure 100. One end of the feed unit 160 is electrically connected to the first radiator 110 at the feed point 113, and the other end of the feed unit 160 is electrically connected to the feed unit 160. The matching network 174 may be configured to match an electrical signal in the feed unit 160 with an impedance characteristic of the radiation part of the antenna structure 100, to minimize a transmission loss and distortion of the electrical signal, and improve the radiation characteristic of the antenna structure 100. In an embodiment, the matching network 174 may include at least one of a capacitor, an inductor, or a resistor. For example, the matching network may adopt a form in which capacitors may be first connected in parallel, and then capacitors are connected in series. A specific form of the matching network 174 is not limited in this application.

In an embodiment, the operating frequency band of the antenna structure 100 may include a sub 6 GHZ (sub 6 GHZ) frequency band in a 5G frequency band, for example, an N77 (3.3 GHZ to 4.2 GHZ) frequency band or an N79 (4.4 GHZ to 5.0 GHZ) frequency band.

Figure 8:
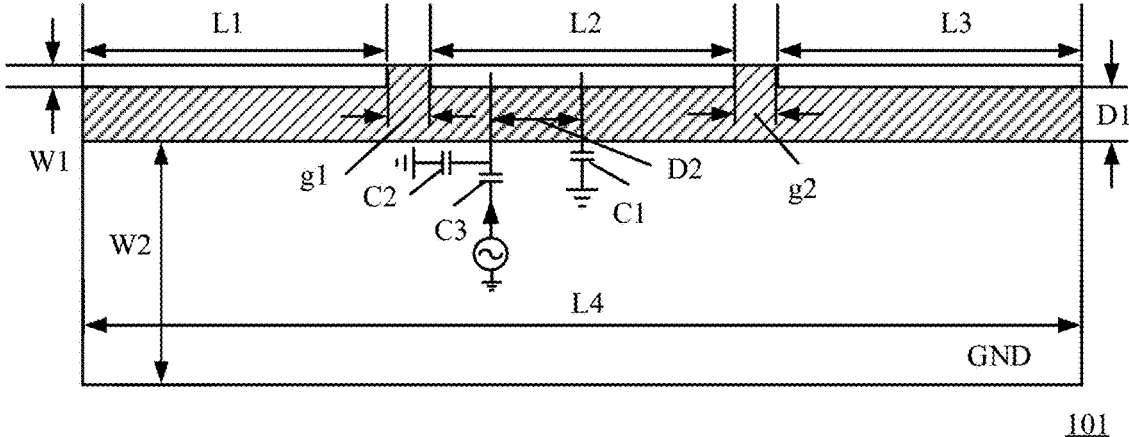
FIG. 8 shows an antenna structure that is an antenna structure 101 according to an embodiment of this application.
Figure 9:
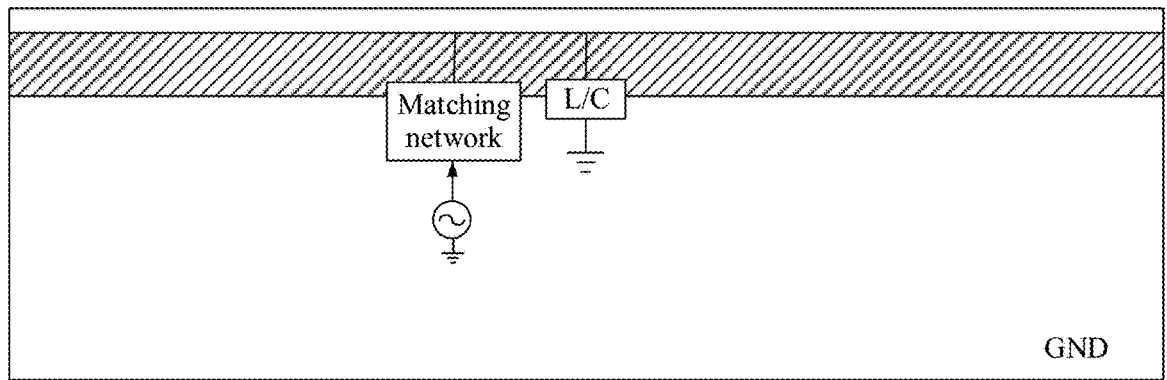
FIG. 9 shows an antenna structure that is an antenna structure 102 for comparison.

FIG. 8 and FIG. 9 show a group of antenna structures according to an embodiment of this application. FIG. 8 shows an antenna structure that is an antenna structure 101 according to an embodiment of this application. FIG. 9 shows an antenna structure that is an antenna structure 102 for comparison.

As shown in FIG. 8 and FIG. 9, for the antenna structure 101 and the antenna structure 102, both radiation parts of the antenna structure 101 and the antenna structure 102 use copper as a conductor material, with a conductivity of 5.8×10⁷. A structural difference between the antenna structure 101 and the antenna structure 102 lies only in that the radiation part of the antenna structure 101 is provided with gaps for dividing the radiation into a first radiator, a second radiator, and a third radiator. In addition, in the antenna structure 101, energy is coupled from the first radiator to the second radiator and the third radiator through the first gap and the second gap. Therefore, in this embodiment, an overlap area of the radiators on two sides of the first gap and the second gap is 3 mm².

For example, parameters of the antenna structure 101 shown in FIG. 8 in the following simulation diagram are shown in Table 1:

TABLE 1

| L1 | L2 | L3 | g1 | g2 |
|---|---|---|---|---|
| 17.5 mm | 18.4 mm | 17.5 mm | 0.8 mm | 0.8 mm |
| D1 | D2 | W1 | W2 | L4 |
| 2 mm | 3.3 mm | 1 mm | 75 mm | 155 mm |
| C1 | C2 | C3 | Dielectric constant | Loss angle tangent |
| 15 pF | 0.3 pF | 1.5 pF | 4.43 | 0.005 |

L1 is a length of the second radiator, L2 is a length of the first radiator, L3 is a length of the third radiator, g1 is a width of the first gap, g2 is a width of the second gap, D1 is a distance between the radiator of the antenna structure and a ground (ground, GND), D2 is a distance between a ground point and a feed point, W1 is a width of the radiator of the antenna structure, W2 is a width of the ground, and L4 is a length of the ground. C1 is a capacitance value of a ground element connected in series between the ground point and the ground, and C2 and C3 are capacitance values of a matching network connected in series between the feed unit and the feed point. It should be understood that C1, C2, and C3 indicate a case in which the ground element and the matching network are disposed for adjusting a radiation characteristic of the antenna structure 101. The ground element and the matching network in the antenna structure 102 may also be correspondingly adjusted, so that resonant frequency bands of the antenna structure 101 and the antenna structure 102 are close to each other for comparison. The dielectric constant and the loss angle tangent are parameters of a medium disposed between the radiation part and the ground.

It should be understood that the foregoing parameters of the antenna structure 101 are merely used as an example. A specific parameter of the antenna structure is not limited in this application, and may be adjusted based on an actual design or production requirement.

Figure 10:
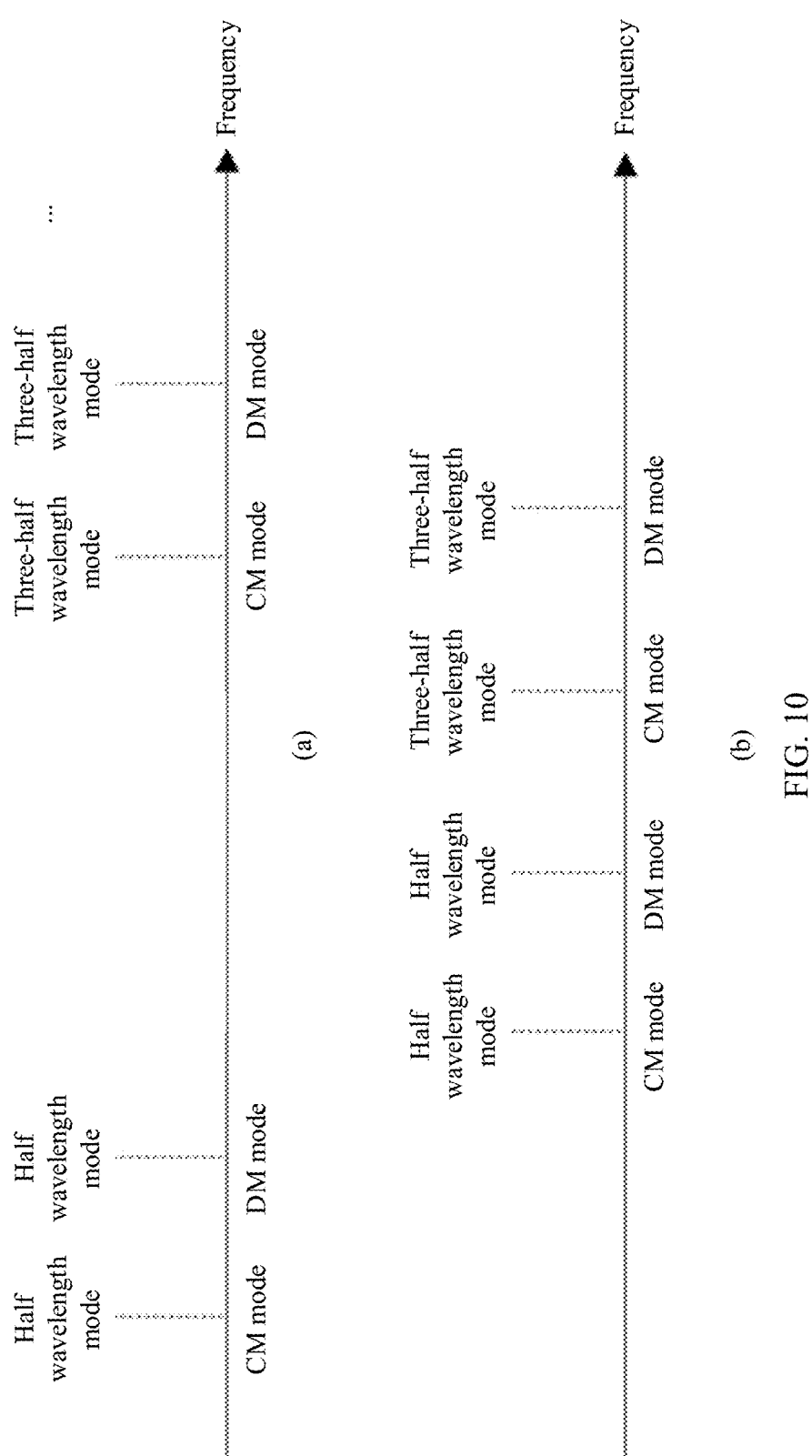
FIG. 10 is a schematic diagram of distribution of resonances generated by the antenna structures shown in FIG. 8 and FIG. 9.

FIG. 10 is a schematic diagram of distribution of resonances generated by the antenna structures shown in FIG. 8 and FIG. 9.

Herein, (a) in FIG. 10 shows a schematic diagram of resonances generated by the antenna structure 102 shown in FIG. 9 on a frequency spectrum. There is a frequency multiplication relationship between resonance frequencies of the antenna structure 102 in half wavelength modes (first-order modes) and three-half wavelength modes (third-order modes) in a CM mode and a DM mode. A resonant frequency band generated in the first-order mode is far away from a resonant frequency band generated in the third-order mode.

Herein, (b) in FIG. 10 shows a schematic diagram of resonances generated by the antenna structure 101 shown in FIG. 8 on a frequency spectrum. Gaps are formed between the radiators, so that resonance frequencies of the antenna structure 101 in the half wavelength modes (the first-order modes) and the three-half wavelength modes (the third-order modes) in the CM mode and the DM mode are close to each other, and have no frequency multiplication relationship. In this way, a broadband antenna is implemented, and requirements of a plurality of communication frequency bands are meet.

Figure 11:
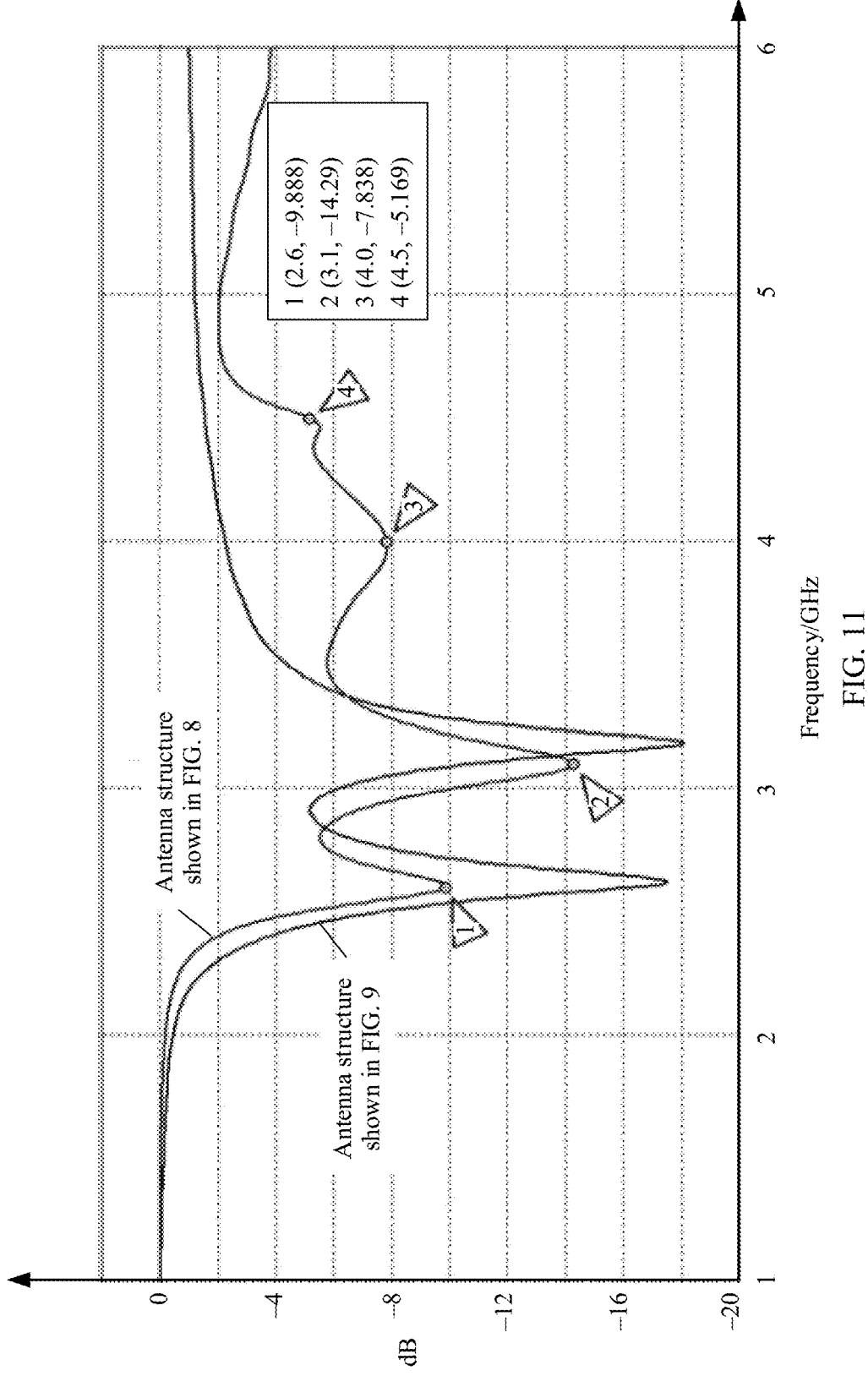
FIG. 11 is a diagram of simulation results of S11 of the antenna structures shown in FIG. 8 and FIG. 9.
Figure 12:
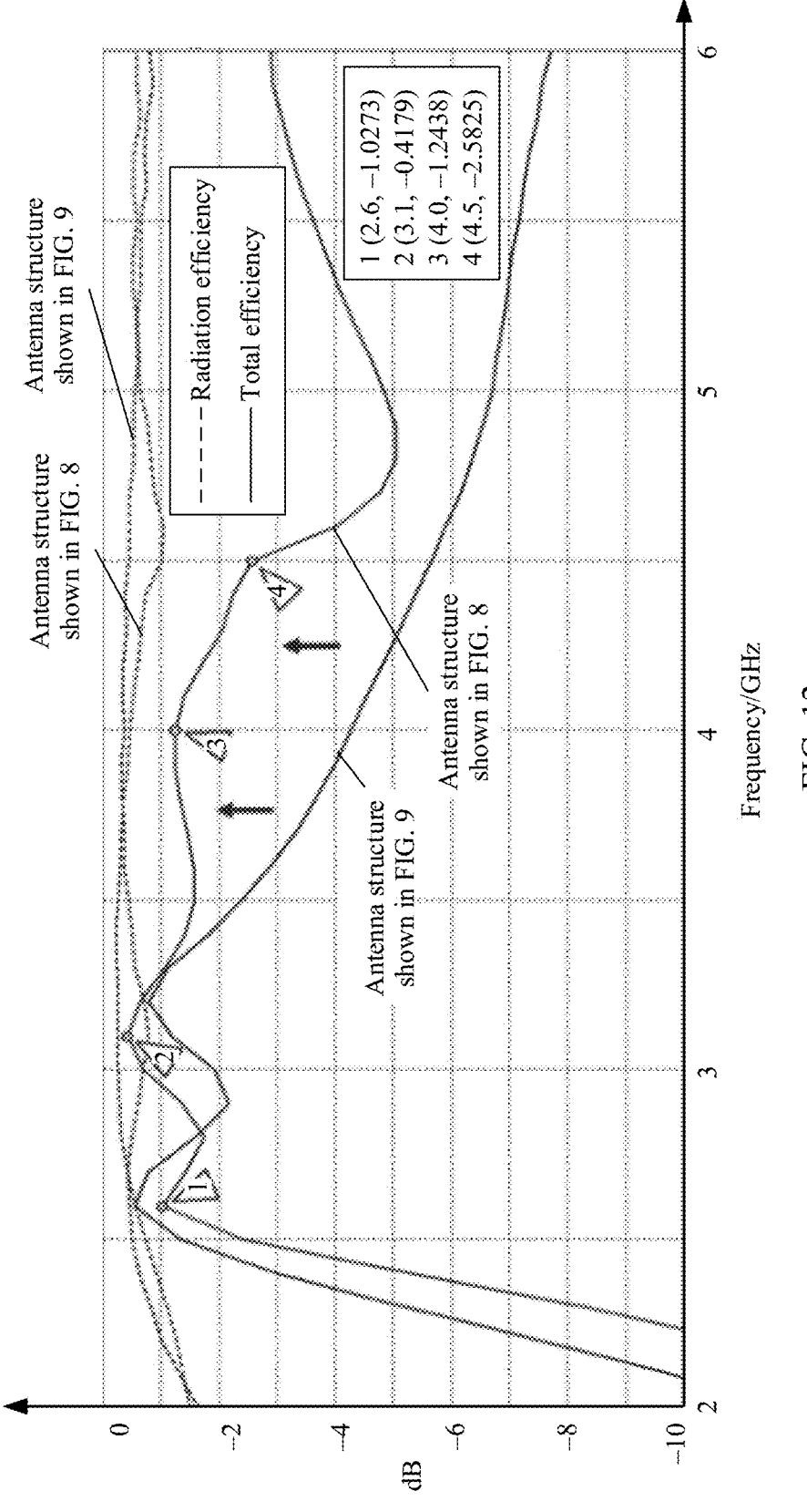
FIG. 12 is a diagram of simulation results of radiation efficiency (radiation efficiency) and total efficiency (total efficiency) of the antenna structures shown in FIG. 8 and FIG. 9.

FIG. 11 and FIG. 12 are simulation diagrams of the antenna structures shown in FIG. 8 and FIG. 9. FIG. 11 is a diagram of simulation results of S11 of the antenna structures shown in FIG. 8 and FIG. 9. FIG. 12 is a diagram of simulation results of radiation efficiency (radiation efficiency) and total efficiency (total efficiency) of the antenna structures shown in FIG. 8 and FIG. 9.

It should be understood that, in schematic diagrams of frequency spectrums generated by the antenna structures shown in FIG. 10, schematic diagrams of resonances generated by the antenna structure 101 and the antenna structure 102 under a same parameter (for example, a length of a radiator, a matching or ground element) on a frequency spectrum are shown. In the simulation diagrams shown in FIG. 11 and FIG. 12, parameters of the antenna structure 101 and the antenna structure 102 may be adjusted to compare performance of the antenna structures, so that a resonant frequency band of the antenna structure 101 in a low-order mode is the same as a resonant frequency band of the antenna structure 102.

As shown in FIG. 11, the antenna structure shown in FIG. 8 and the antenna structure shown in FIG. 9 have a same resonance start position, at approximately 2.6 GHZ.

Resonance frequencies of the antenna structure shown in FIG. 9 in the half wavelength mode (the first-order mode) and the three-half wavelength mode (the third-order mode) have a frequency multiplication relationship, so that two resonances are generated in 2 GHZ to 6 GHZ, to correspond to a half wavelength mode in a CM mode and a half wavelength mode in a DM mode.

However, a parameter of the antenna structure is adjusted, so that resonant frequency bands generated by the antenna structure shown in FIG. 8 in a multi-order resonance mode (for example, the half wavelength mode or three-half wavelength mode) are close to each other. Therefore, four resonances (a first resonance, a second resonance, a third resonance, and a fourth resonance) may be generated in 2 GHZ to 6 GH, and may respectively correspond to the half wavelength mode in the CM mode and the half wavelength mode in the DM mode, the three-half wavelength mode in the CM mode, and the three-half wavelength mode in DM mode. In this way, an operating bandwidth of the antenna structure is expanded by using a plurality of resonant frequency bands.

S11<−4 dB is used as a boundary. In the antenna structure shown in FIG. 8, two high-frequency resonance modes (the three-half wavelength mode in the CM mode and the three-half wavelength mode in the DM mode) are introduced, and resonant frequency bands of any two adjacent resonances of the first resonance, the second resonance, the third resonance, and the fourth resonance partially overlap, so that an operating bandwidth of the antenna structure is twice that of the antenna structure shown in FIG. 9, and requirements of more communication frequency bands can be met.

As shown in FIG. 12, radiation efficiency of the antenna structure shown in FIG. 8 is close to radiation efficiency of the antenna structure shown in FIG. 9. However, total efficiency of the antenna structure shown in FIG. 9 quickly drops at a frequency higher than 3.1 GHZ, and an efficiency pit occurs. In the antenna structure shown in FIG. 8, two high-frequency resonance modes (the three-half wavelength mode in the CM mode and the three-half wavelength mode in the DM mode) are introduced, so that flatness of total efficiency from 3.1 GHZ to 4.5 GHZ is increased.

Total efficiency>−3 dB is used as a boundary, and a bandwidth of total efficiency of the antenna structure shown in FIG. 8 is twice that of the total efficiency of the antenna structure shown in FIG. 9, so that requirements of more communication frequency bands can be met.

Figure 13:
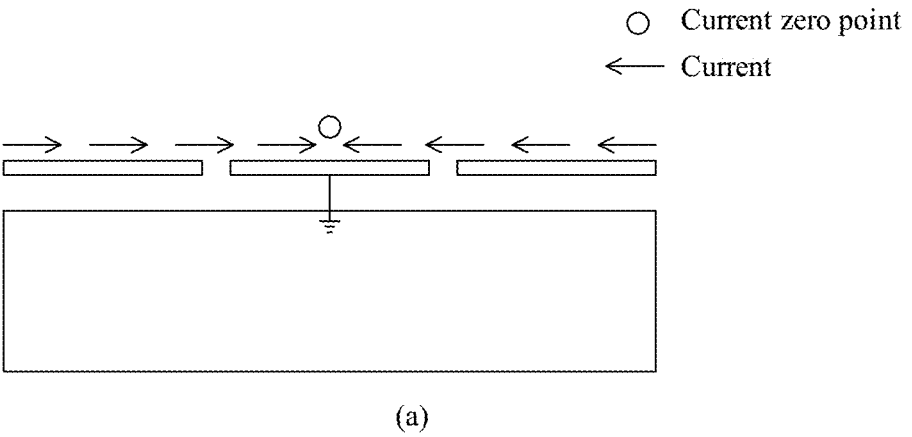
FIG. 13 is a schematic diagram of distribution of currents of an antenna structure according to an embodiment of this application.
Figure 13:
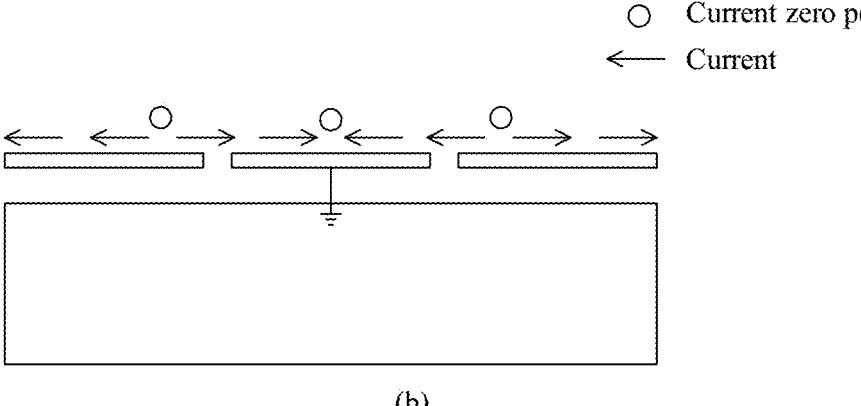

FIG. 13 is a schematic diagram of distribution of currents of an antenna structure according to an embodiment of this application.

Herein, (a) in FIG. 13 shows a diagram of distribution of currents of the antenna structure shown in FIG. 8 corresponding to a half wavelength mode in a CM mode. A current zero point of the antenna structure is located at the ground point, and the currents are symmetrically distributed along the ground point.

Herein, (b) in FIG. 13 shows a diagram of distribution of currents of the antenna structure shown in FIG. 8 corresponding to a three-half wavelength mode in a CM mode. Current zero points of the antenna structure are respectively located on two sides of the ground point and the ground point, and the currents are symmetrically distributed along the ground point.

For the distribution of the currents shown in (a) in FIG. 13, because the first gap is provided between the first radiator and the second radiator, and the second gap is provided between the first radiator and the third radiator, a current on the radiation part is coupled and transmitted by using the gaps between the radiators, so that a transmission path of the current is shortened, a corresponding electrical length is shortened, a frequency of a resonant frequency band shifts to a high frequency, and the resonant frequency band is closer to a resonant frequency band generated in the half-three-wavelength mode than a case in which the current is not coupled by using the gaps and is transmitted on the radiator. In addition, because the current is coupled and transmitted by using the gap between the radiators, a resonance generated in the three-half wavelength mode is also affected by the gap. However, compared with a low-order mode (a half wavelength mode), a high-order mode (a three-half wavelength mode) is less affected. A general rule is that a frequency shift range of a resonant frequency band generated in the low-order mode is larger than that of a resonant frequency band generated in the high-order mode.

In addition, theoretically, if the gap is disposed closer to a current strong point in a resonance mode of the antenna structure, currents at the current strong point are dispersed. Therefore, impact on the resonance mode is greater. Similarly, if the gap is disposed closer to a current zero point of a resonant mode, impact on distribution of currents is small. Therefore, impact on the resonant mode is small.

It should be understood that, for the radiation part of the antenna structure, the radiation part has a plurality of modes that can be excited, for example, a (N−½)-wavelength mode and an N-time wavelength mode, where N is a positive integer. A mode corresponding to the radiation part can be excited provided that input impedance of the radiation part is consistent with impedance of an excitation source. In this embodiment of this application, a case in which the antenna structure generates the (N−½)-wavelength mode is used for description, for example, a half wavelength mode or a three-half wavelength mode. This is because boundary conditions of the (N−½)-wavelength mode and the N-time wavelength mode are different. As shown in FIG. 13, for a (N−½)-wavelength mode in the CM mode, the ground point of the radiation part of the antenna structure is a current zero point, and the current zero point in the N-time wavelength mode is not located at this position. Therefore, in an embodiment, the N-time wavelength mode of the antenna structure may be excited by changing a boundary condition of the antenna structure. For example, a filter may be connected in series between the ground point and the ground, so that the antenna structure operates in the (N−½)-wavelength mode and has a band-pass characteristic, that is, the filter is turned on. Alternatively, the antenna structure operates in the N-time wavelength mode and has a band-stop characteristic, that is, the filter is not turned on, and both the N-time wavelength mode and (N−½)-wavelength mode may be excited. In an embodiment, the filter may be a surface acoustic wave (surface acoustic wave, SAW) filter, a bulk acoustic wave (bulk acoustic wave, BAW) filter, or a film bulk acoustic resonator (film bulk acoustic resonator, FBAR). Alternatively, the filter may be a filter in another form. This is not limited in this application.

Figure 14:
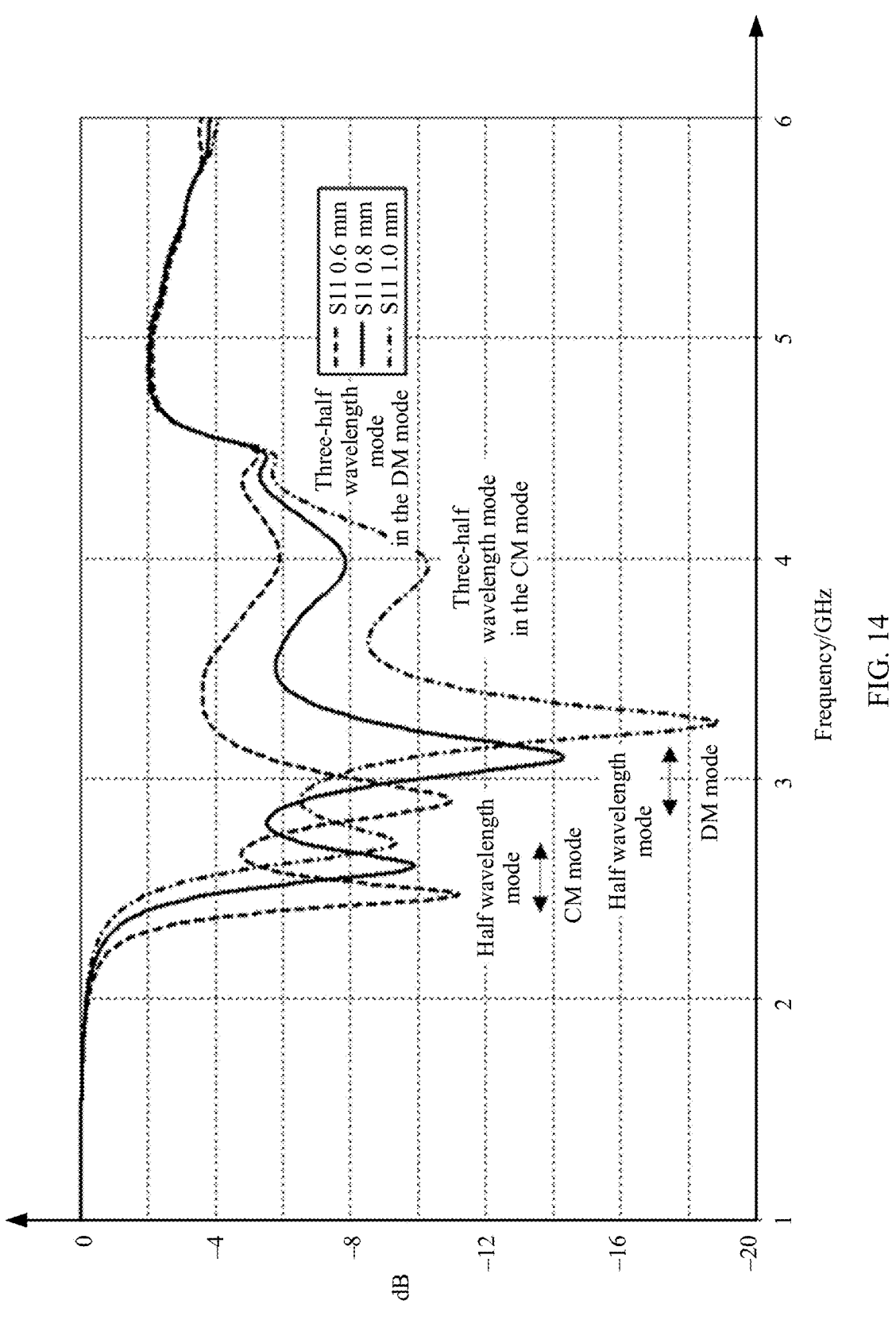
FIG. 14 is a diagram of simulation results of S11 of antenna structures with different gap widths according to an embodiment of this application.

FIG. 14 is a diagram of simulation results of S11 of antenna structures with different gap widths according to an embodiment of this application.

It should be understood that, in the diagram of simulation results provided in this embodiment, an example in which a width of a first gap is the same as a width of a second gap is used for description. During actual application, the width of the first gap may be different from the width of the second gap. This is not limited in this application.

As shown in FIG. 14, in a process in which the widths of the first gap and the second gap on two sides of a first radiator gradually increase from 0.6 mm to 1.0 mm, frequencies of resonant frequency bands generated in half wavelength modes (in a CM mode and a DM mode) continuously shift to high frequencies, so that the resonant frequency bands generated gradually approach resonant frequency bands generated in three-half wavelength modes (in the CM mode and the DM mode).

However, in the simulation results shown in FIG. 14, the frequencies of the resonant frequency bands generated in the three-half wavelength modes (in the CM mode and the DM mode) are basically unchanged. By adjusting the widths of the first gap and the second gap, a frequency spacing between the resonant frequency band generated in the half wavelength mode and the resonant frequency band generated in the three-half wavelength mode can be effectively adjusted, to form a required operating bandwidth of the antenna structure.

It should be understood that, in this embodiment, the widths of the first gap and the second gap are adjusted to change a capacitance value of an equivalent capacitor of the first gap and the second gap, to control coupling between radiators. In this way, the frequency spacing between the resonant frequency band generated in the half wavelength mode and the resonant frequency band generated in the half wavelength mode is implemented. During actual application, the capacitance value of the equivalent capacitor of the first gap and the second gap may be adjusted by disposing a second medium in the first gap and the second gap, adjusting an overlap area of radiators on the two sides of the first gap and the second gap, or disposing capacitors in both the first gap and the second gap. This is not limited in this application.

Figure 15:
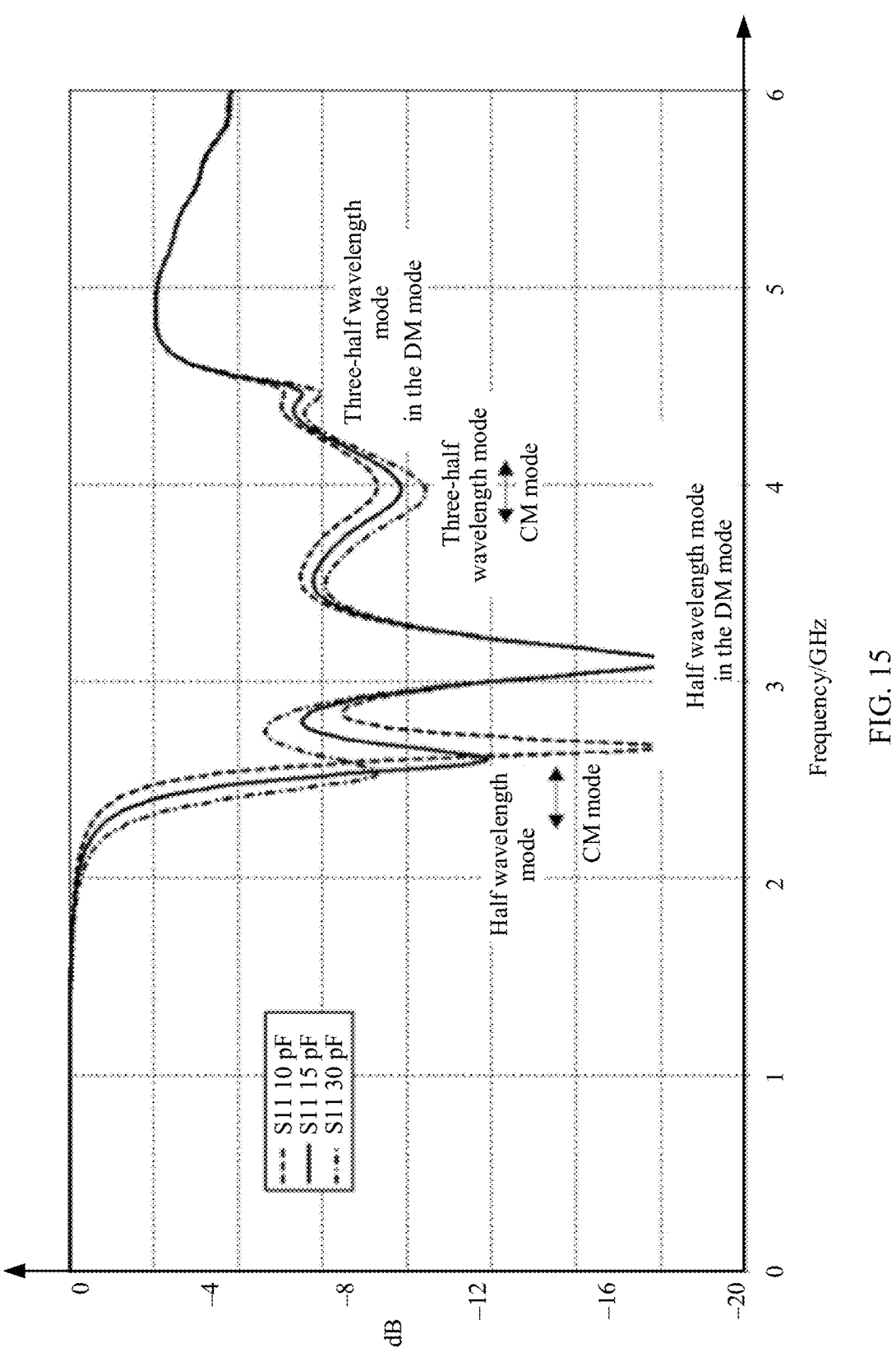
FIG. 15 is a diagram of simulation results of S11 of antenna structures whose ground elements have different electrical parameters according to an embodiment of this application.

FIG. 15 is a diagram of simulation results of S11 of antenna structures whose ground elements have different electrical parameters according to an embodiment of this application.

It should be understood that, for brevity of description, an example in which a ground element is a capacitor is used for description in the diagram of simulation results provided in this embodiment. During actual application, the ground element may be at least one of a capacitor, an inductor, or a resistor, or the ground element may be an impedance network including a plurality of electronic elements (a capacitor, an inductor, or a resistor). This is not limited in this application.

As shown in FIG. 15, in a process in which a capacitance value of the ground element gradually increases from 10 pF to 30 pF, a frequency of a resonant frequency band generated in a CM mode (a half wavelength mode and a three-half wavelength mode) continuously shifts to a low frequency.

However, in the simulation results shown in FIG. 15, frequencies of resonant frequency bands generated in a DM mode (a half wavelength mode and a three-half wavelength mode) are basically unchanged. By adjusting the capacitance value of the ground element, a frequency spacing between the resonant frequency band generated in the CM mode and the resonant frequency band generated in the DM mode can be effectively adjusted, to form a required operating bandwidth of the antenna structure.

It should be understood that, for the foregoing characteristic, because the CM mode is a current zero point at a joint (a ground point) between the ground element and the first radiator, as shown in FIG. 13, a change of an electrical characteristic at the ground point causes a change of a resonant frequency band in the CM mode. However, for the DM mode, the joint between the ground element and the first radiator is not a current zero point, and is not interfered by the change of the electrical characteristic at the ground point. In addition, in the CM mode, compared with the three-half wavelength mode, the half wavelength mode is more sensitive to capacitor adjustment, so that a larger frequency offset is generated because the half wavelength mode has a lower frequency.

Table 2 and Table 3 below respectively show normalized (18 dBm) 5 mm body (body) SAR values of the antenna structures shown in FIG. 9 and FIG. 8.

TABLE 2

| (antenna structure shown in FIG. 9) | | |
| --- | --- | --- |
| Test frequency band | 1 g | 10 g |
| 2.6 GHz | 1.16 | 0.52 |
| 3.2 GHz | 8.37 | 2.87 |

TABLE 3

| (antenna structure shown in FIG. 8) | | |
| --- | --- | --- |
| Test frequency band | 1 g | 10 g |
| 2.6 GHz | 1.60 | 0.74 |
| 3.1 GHz | 3.38 | 1.36 |
| 4.0 GHz | 6.03 | 1.69 |
| 4.5 GHz | 5.32 | 1.37 |

As shown in the foregoing table, at 2.6 GHZ, the antenna structure operates in the half wavelength mode in the CM mode, and both the antenna structures shown in FIG. 8 and FIG. 9 have a good SAR. However, near 3 GHZ, the antenna structure operates in the three-half wavelength mode in the DM mode, and an SAR value of the antenna structure shown in FIG. 8 is greatly reduced compared with that of the antenna structure shown in FIG. 9. In addition, in the three-half wavelength mode in the CM mode (4.0 GHZ) and the three-half wavelength mode in the DM mode (4.5 GHZ), the SAR values of the antenna structure shown in FIG. 8 in the two modes are close, and are still significantly lower than the SAR value of the antenna structure shown in FIG. 9 in the DM mode. Therefore, in terms of SAR, it is indicated that the antenna structure provided in embodiments of this application is suitable for broadband application of an electronic device.

Figure 16:
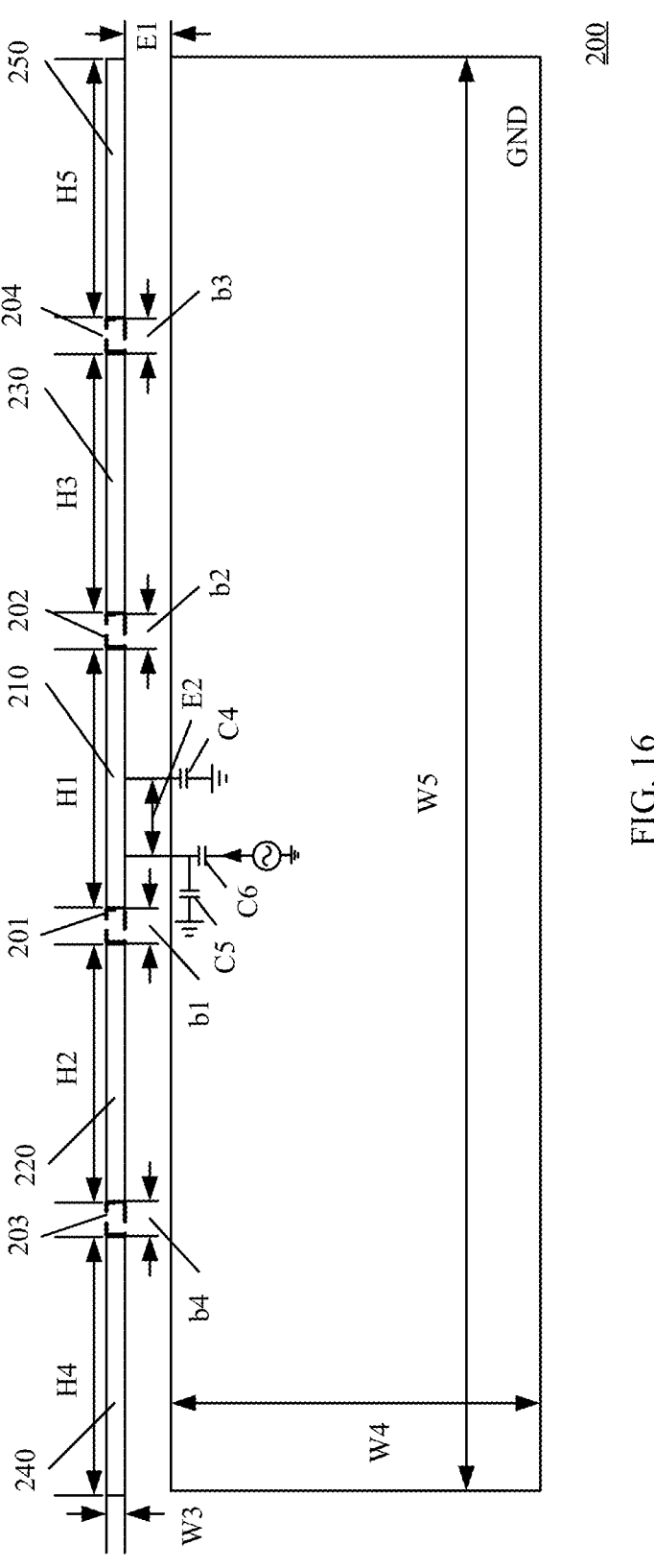
FIG. 16 is a schematic diagram of a structure of an antenna structure 200 according to an embodiment of this application.

FIG. 16 is a schematic diagram of a structure of an antenna structure 200 according to an embodiment of this application.

As shown in FIG. 16, a radiator of the antenna structure 200 may include a first radiator 210, a second radiator 220, a third radiator 230, a fourth radiator 240, and a fifth radiator 250. The first radiator 210, the second radiator 220, the third radiator 230, the fourth radiator 240, and the fifth radiator 250 are used as a radiation part of the antenna structure 200. The first radiator 210, the second radiator 220, the third radiator 230, the fourth radiator 240, and the fifth radiator 250 jointly generate at least one resonance.

It should be understood that the radiation part of the antenna structure may include a plurality of radiators, and is not limited to the three radiators or the five radiators provided in embodiments of this application. Adjustment may be performed according to an actual production or design requirement. This is not limited in this application.

A first end of the first radiator 210 and a first end of the second radiator 220 are opposite to, but do not touch each other, and a first gap 201 is formed between the first end of the first radiator 210 and the first end of the second radiator 220. A second end of the first radiator 210 and a first end of the third radiator 230 are opposite to, but do not touch each other, and a second gap 202 is formed between the second end of the first radiator 210 and the first end of the third radiator 230. A first end of the fourth radiator 240) and a second end of the second radiator 220 are opposite to, but do not touch each other, and a third gap 203 is formed between the first end of the fourth radiator 240) and the second end of the second radiator 220. A first end of the fifth radiator 250) and a second end of the third radiator 230 are opposite to, but do not touch each other, and a fourth gap 204 is formed between the first end of the fifth radiator 250 and the second end of the third radiator 230. The first radiator 210 is provided with a feed point and a ground point. The ground point is disposed in a central region. The ground point is electrically connected to a ground for grounding the antenna structure 200. The feed point is disposed between the central region and the first end of the first radiator. The feed point is electrically connected to a feed unit for feeding the antenna structure 200.

Compared with the antenna structure 100 shown in FIG. 4, in the antenna structure 200 shown in FIG. 16, the fourth radiator 240) and the fifth radiator 250 are additionally disposed based on the antenna structure 100, and the third gap 203 is formed by using the fourth radiator 240) and the second radiator 220, and the fourth gap 204 is formed by using the fifth radiator 250 and the third radiator 230, so that a higher-order resonance mode (the higher-order resonance mode and the original resonance mode are close to each other) generated by the antenna structure 200 may be further added, for example, a five-half wavelength mode in a CM mode and a five-half wavelength mode in a DM mode may be added, to further expand an operating bandwidth of the antenna structure 200.

In an embodiment, when an electrical signal is fed at the feed point, the first radiator 210, the second radiator 220, the third radiator 230, the fourth radiator 240, and the fifth radiator 250 jointly generate a first resonance (a half wavelength mode in the CM mode), a second resonance (a half wavelength mode in the DM mode), a third resonance (a three-half wavelength mode in the CM mode), a fourth resonance (a three-half wavelength mode in the DM mode), a fifth resonance (a five-half wavelength mode in the CM mode), and a sixth resonance (a five-half wavelength mode in the DM mode).

In an embodiment, resonant frequency bands of any two adjacent resonances of the first resonance, the second resonance, the third resonance, the fourth resonance, the fifth resonance, and the sixth resonance partially overlap, to expand an operating bandwidth of the antenna structure 200).

In an embodiment, the second radiator 220 and the third radiator 230 may have a same length.

In an embodiment, the fourth radiator 240) and the fifth radiator 250 may have a same length.

In an embodiment, the first gap 201 and the second gap 202 may have a same width.

In an embodiment, the third gap 203 and the fourth gap 204 may have a same width.

It should be understood that as symmetry of a radiation part of the antenna structure 200 increases, a radiation characteristic (for example, a bandwidth and a gain) of the antenna structure 200 increases accordingly. When the second radiator 220, the third radiator 230, the fourth radiator 240, and the fifth radiator 250 are symmetrical along a virtual axis (the first radiator 210 has a same length on two sides of the virtual axis) of the first radiator 210, the antenna structure 200 has a better radiation characteristic.

In an embodiment, a ground element may be disposed between the ground point and the ground. For brevity of description, in the antenna structure 200 shown in FIG. 16, an example in which the ground element is a capacitor is used for description. In an embodiment, the ground element may alternatively be an inductor. Alternatively, the ground element may be an impedance network including a plurality of electronic elements. This is not limited in this application.

In an embodiment, a matching network may be disposed between the feed point and the feed unit. One end of the feed unit is electrically connected to the first radiator at the feed point, and the other end of the feed unit is electrically connected to the feed unit. The matching network may be configured to match an electrical signal in the feed unit with an impedance characteristic of the radiation part of the antenna structure, to minimize a transmission loss and distortion of the electrical signal. For brevity of description, in the antenna structure 200 shown in FIG. 16, a matching network is described in a form in which capacitors are first connected in parallel and then capacitors are connected in series. A specific form of the matching network is not limited in this application.

For example, parameters of the antenna structure 200 shown in FIG. 16 in the following simulation diagram are shown in Table 4:

TABLE 4

| H1 | H2 | H3 | H4 | H5 |
|---|---|---|---|---|
| 15.2 mm | 9.6 mm | 9.6 mm | 11 mm | 11 mm |
| b1 | b2 | b3 | b4 | E1 |
| 0.4 mm | 0.4 mm | 0.4 mm | 0.4 mm | 2 mm |
| E2 | W3 | W4 | W5 | C4 |
| 3.3 mm | 1 mm | 75 mm | 155 mm | 12 pF |
| C5 | C6 | Dielectric constant | | Loss angle tangent |
| 0.2 pF | 1.5 pF | 4.43 | | 0.005 |

H1 is a length of the first radiator, H2 is a length of the second radiator, H3 is a length of the third radiator, H4 is a length of the fourth radiator, H5 is a length of the fifth radiator, b1 is a width of the first gap, b2 is a width of the second gap, b1 is a width of the third gap, b2 is a width of the fourth gap, E1 is a distance between the radiation part of the antenna structure and the ground, E2 is a distance between the ground point and the feed point, W3 is a width of the radiation part of the antenna structure, W4 is a width of the ground, and W5 is a length of the ground, C4 is a capacitance value of a ground element connected in series between the ground point and the ground, and C5 and C6 are capacitance values of a matching network connected in series between the feed unit and the feed point. It should be understood that C4, C5, and C6 indicate a case in which the ground element and the matching network are disposed for adjusting a radiation characteristic of the antenna structure 200. The dielectric constant and the loss angle tangent are parameters of a medium disposed between the radiation part and the ground.

It should be understood that the foregoing parameters of the antenna structure 200 are merely used as an example. A specific parameter of the antenna structure is not limited in this application, and may be adjusted based on an actual design or production requirement.

Figure 17:
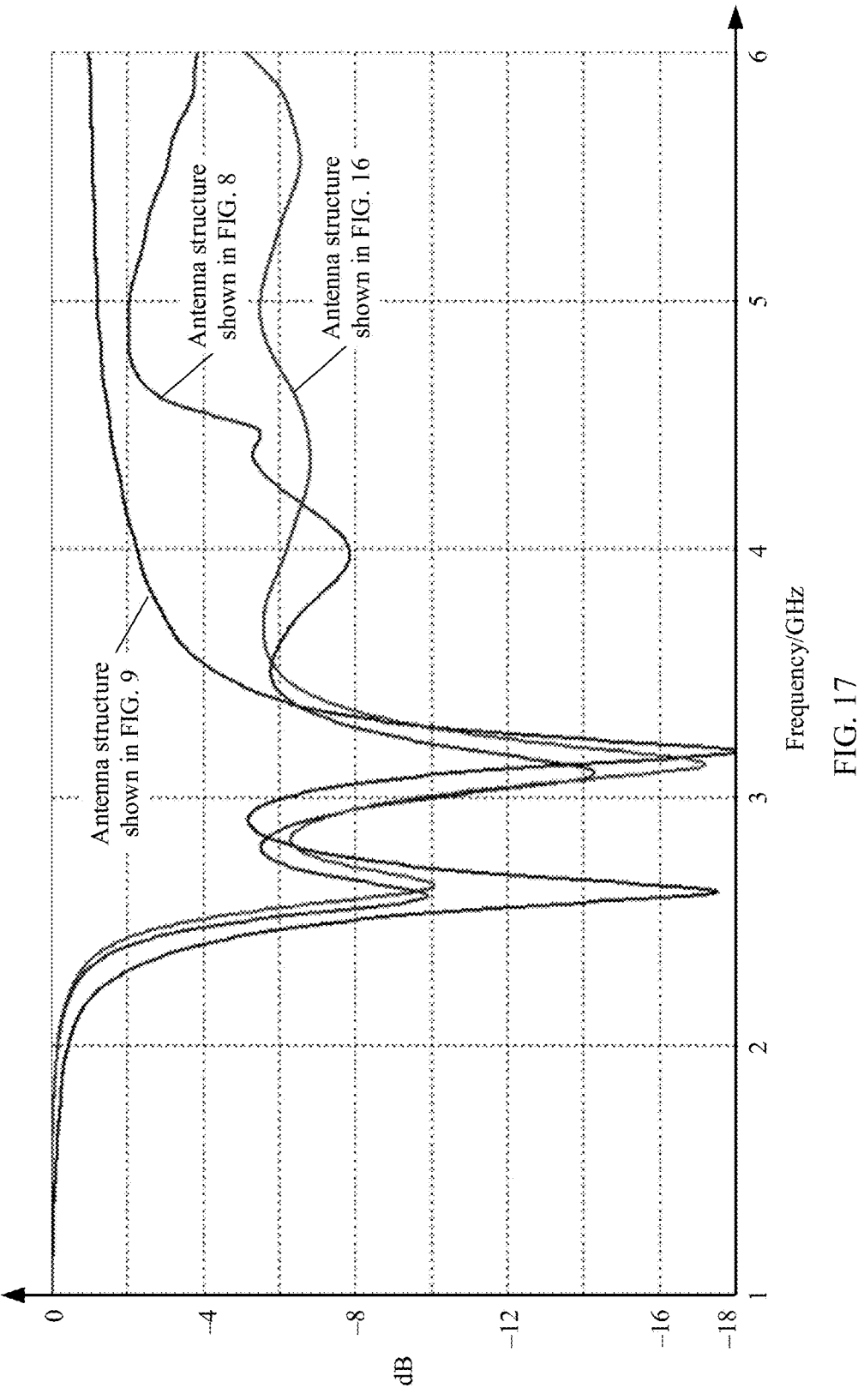
FIG. 17 is a diagram of simulation results of S11 of the antenna structure shown in FIG. 16.
Figure 18:
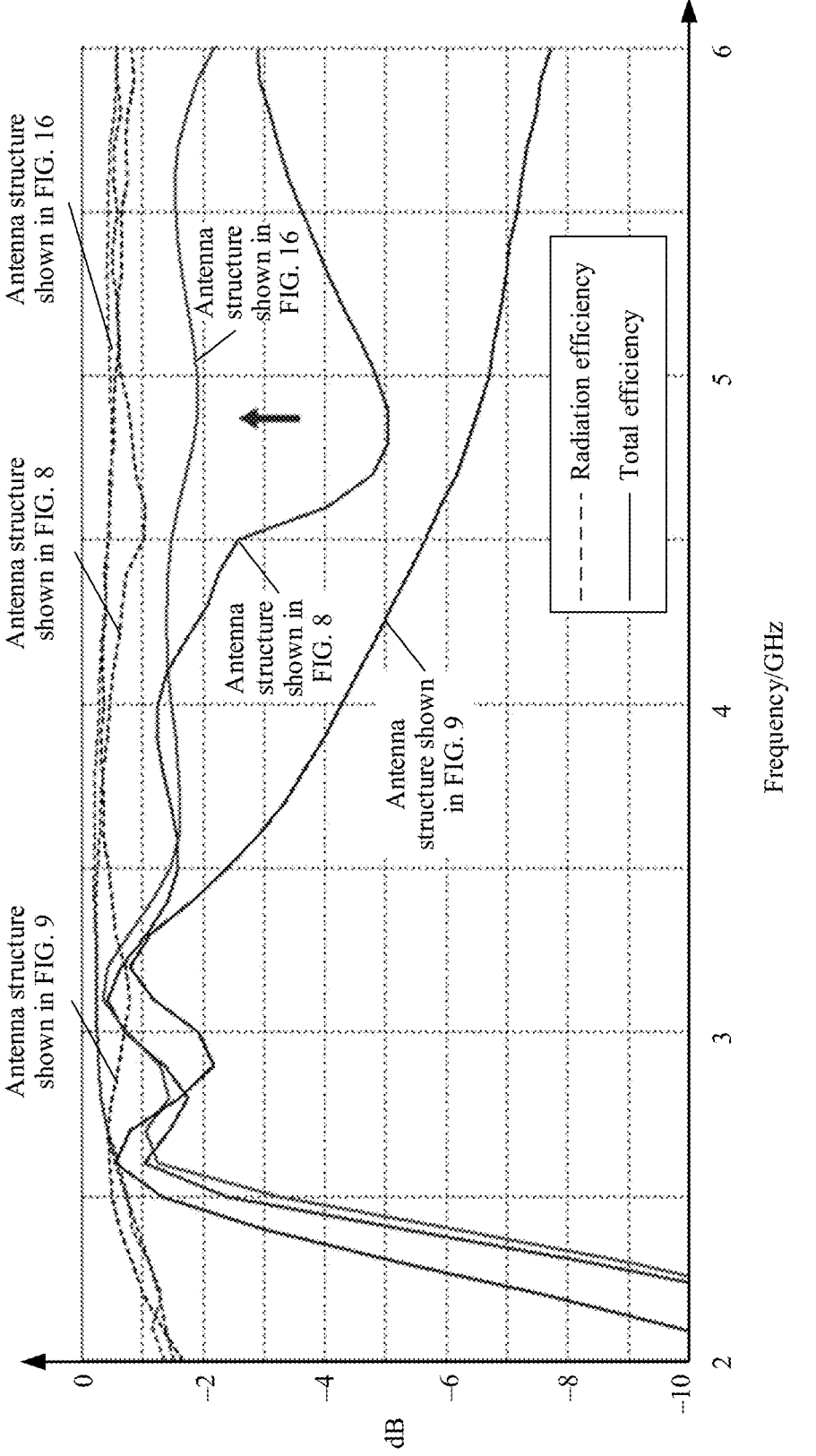
FIG. 18 is a diagram of simulation results of radiation efficiency and total efficiency of the antenna structure shown in FIG. 16.

FIG. 17 and FIG. 18 are simulation diagrams of the antenna structure shown in FIG. 16. FIG. 17 is a diagram of simulation results of S11 of the antenna structure shown in FIG. 16. FIG. 18 is a diagram of simulation results of radiation efficiency and total efficiency of the antenna structure shown in FIG. 16.

It should be understood that, in the simulation diagrams shown in FIG. 17 and FIG. 18, to facilitate comparison between performance of the antenna structure 200 and performance of the antenna structures shown in FIG. 8 and FIG. 9, a parameter of the antenna structure may be adjusted, so that a resonant frequency band of the antenna structure 200 in a low-order mode is the same as a resonant frequency band of the antenna structure 101 in a low-order mode, and a resonant frequency band of the antenna structure 102.

As shown in FIG. 17, the antenna structure 200 shown in FIG. 16, the antenna structure shown in FIG. 8, and the antenna structure shown in FIG. 9 have a same resonance start position, at approximately 2.6 GHZ. Compared with the antenna structure shown in FIG. 9, the antenna structure shown in FIG. 8 expands an operating bandwidth of the antenna structure in a three-half wavelength mode in a CM mode and a three-half wavelength mode in a DM mode. However, based on the antenna structure shown in FIG. 8, the antenna structure shown in FIG. 17 may use a higher-order resonance mode (for example, a five-half wavelength mode in a CM mode and a five-half wavelength mode in a DM mode) to make the higher-order resonance mode close to the original resonance mode, so that an operating bandwidth of the antenna structure is further expanded, and the operating bandwidth of the antenna structure can meet requirements of more communication frequency bands. For example, the operating frequency band of the antenna structure may include a N77 (3.3 GHZ to 4.2 GHz) frequency band and a N79 (4.4 GHz to 5.0 GHz) frequency band in a 5G frequency band.

As shown in FIG. 18, radiation efficiency of the antenna structure 200 shown in FIG. 16 is close to radiation efficiency of the antenna structure shown in FIG. 8 and radiation efficiency of the antenna structure shown in FIG. 9. However, total efficiency of the antenna structure shown in FIG. 9 quickly drops at a frequency higher than 3.1 GHZ, and an efficiency pit occurs. In the antenna structure shown in FIG. 8, a three-half wavelength mode in a CM mode and a three-half wavelength mode in a DM mode are introduced, so that flatness of total efficiency from 3.1 GHz to 4.5 GHz is increased. However, total efficiency of the antenna structure shown in FIG. 8 quickly drops at a frequency higher than 4.5 GHZ. The antenna structure shown in FIG. 17 uses a higher-order resonance mode (for example, a five-half wavelength mode in a CM mode and a five-half wavelength mode in a DM mode) based on the antenna structure shown in FIG. 8, so that flatness of total efficiency of the antenna structure is increased, and a rapid decrease of total efficiency at 4.5 GHz is avoided. Total efficiency>−3 dB is used as a boundary, and an operating bandwidth of the antenna structure shown in FIG. 16 is twice that of the antenna structure shown in FIG. 9, so that requirements of more communication frequency bands can be met. Total efficiency>−3 dB is used as a boundary, and a bandwidth of total efficiency of the antenna structure shown in FIG. 16 is twice that of total efficiency of the antenna structure shown in FIG. 8, so that requirements of more communication frequency bands can be met.

Table 5 below shows normalized (18 dBm) 5 mm body (body) SAR values of the antenna structure shown in FIG. 16.

TABLE 5

| (antenna structure shown in FIG. 16) | | |
| --- | --- | --- |
| Test frequency band | 1 g | 10 g |
| 2.6 GHz | 1.80 | 0.81 |
| 3.1 GHz | 3.45 | 1.35 |
| 4.1 GHz | 4.87 | 1.46 |
| 4.6 GHz | 5.75 | 1.57 |
| 5.0 GHz | 5.28 | 1.42 |
| 5.5 GHz | 4.72 | 1.21 |
| 5.8 GHz | 5.08 | 1.28 |

As shown in the table above, the SAR value is still low within an available bandwidth range (total efficiency>−3 dB) of the total efficiency. Therefore, in terms of SAR, it is indicated that the antenna structure provided in embodiments of this application is suitable for broadband application of an electronic device.

Figure 19:
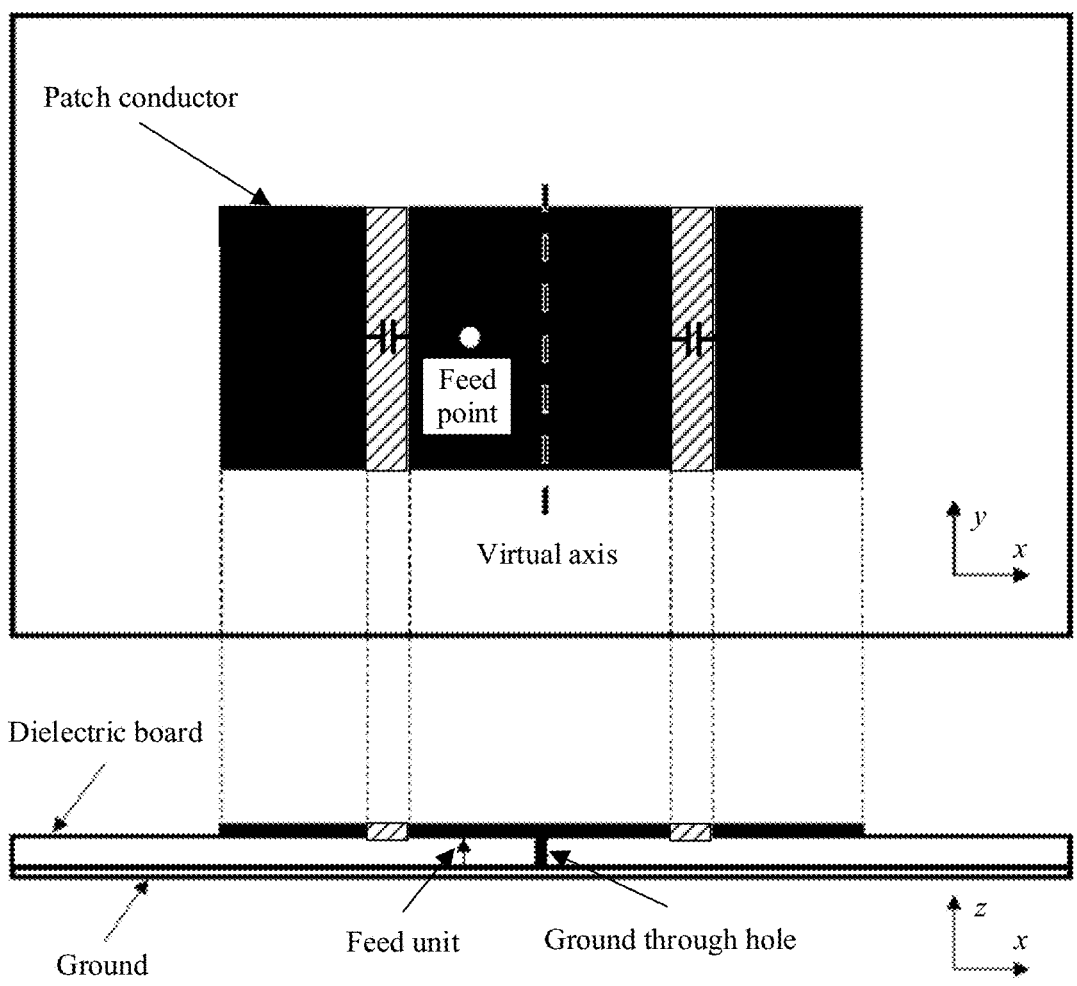
FIG. 19 is a schematic diagram of another antenna structure according to an embodiment of this application.

FIG. 19 is a schematic diagram of another antenna structure according to an embodiment of this application.

In the foregoing embodiments, a wire antenna with a narrow width is used as an example for description. The technical solutions provided in embodiments of this application may also be applied to a planar antenna with a wide width, as shown in FIG. 19.

As shown in FIG. 19, the planar antenna may include a patch conductor, a dielectric board, and a ground.

The patch conductor and the ground are respectively disposed on two opposite surfaces of the dielectric board. A gap is provided between radiators in the patch conductor, and a feed point and a ground point are disposed on a first radiator between the plurality of radiators. The ground point may be disposed on a virtual axis of the first radiator for grounding the planar antenna. The feed point may be disposed on a side that deviates from the virtual axis for feeding the planar antenna.

In an embodiment, the first radiator may be electrically connected to the ground through a ground through hole. In an embodiment, the ground through hole may include a plurality of through holes, and an equivalent capacitance or inductance between the patch conductor and the ground may be adjusted by adjusting a density, a radius, and a depth of each through hole in the plurality of through holes, to control a magnitude of the ground inductance or the capacitance.

In an embodiment, a capacitor may be disposed in a gap between radiators, and is configured to adjust a capacitance value of an equivalent capacitor formed by the gap, to control a radiation characteristic of the planar antenna.

Alternatively, in an embodiment, a medium may be filled in a gap between radiators, and is configured to adjust a capacitance value of an equivalent capacitor formed by using the gap, to control a radiation characteristic of the planar antenna.

A person skilled in the art may use different methods to implement the described functions for each specific application, but such implementation should not be considered beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic or other forms.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
a printed circuit board comprising a first dielectric board and a second dielectric board that are disposed in a stacked manner;
a feed point and a ground point; and
a plurality of radiators comprising a first radiator, a second radiator, and a third radiator, wherein
a first end of the first radiator and a first end of the second radiator are opposite to each other, and form a first gap;
a second end of the first radiator and a first end of the third radiator are opposite to each other, and form a second gap;
the feed point and the ground point are disposed on the first radiator;
the ground point is disposed in a central region of the first radiator or the plurality of radiators;
the feed point is disposed between the central region and the first end of the first radiator;
in response to an electrical signal being fed at the feed point, the first radiator, the second radiator, and the third radiator jointly generate at least one resonance; and the first radiator is disposed between the first dielectric board and the second dielectric board, the second radiator is disposed on an upper surface of the first dielectric board, and the third radiator is disposed on a lower surface of the second dielectric board.

2. The electronic device according to claim 1, wherein the second radiator and the third radiator have a same length.

3. The electronic device according to claim 1, wherein the first gap and the second gap have a same width.

4. The electronic device according to claim 1, wherein neither a feed point nor a ground point is disposed on the second radiator and the third radiator.

5. The electronic device according to claim 1, wherein the at least one resonance comprises a first resonance, a second resonance, a third resonance, and a fourth resonance.

6. The electronic device according to claim 5, wherein resonant frequency bands of any two adjacent resonances of the first resonance, the second resonance, the third resonance, and the fourth resonance partially overlap.

7. The electronic device according to claim 1, wherein
the plurality of radiators further comprises a fourth radiator and a fifth radiator, wherein
a first end of the fourth radiator and a second end of the second radiator are opposite to each other, and form a third gap; and
a first end of the fifth radiator and a second end of the third radiator are opposite to each other, and form a fourth gap.

8. The electronic device according to claim 7, wherein, in response to an electrical signal is fed at the feed point, the first radiator, the second radiator, the third radiator, the fourth radiator, and the fifth radiator jointly generate the at least one resonance.

9. The electronic device according to claim 7, wherein, in response to an electrical signal is fed at the feed point, the first radiator, the second radiator, the third radiator, the fourth radiator, and the fifth radiator jointly generate a first resonance, a second resonance, a third resonance, a fourth resonance, a fifth resonance, and a sixth resonance.

10. The electronic device according to claim 9, wherein resonant frequency bands of any two adjacent resonances of the first resonance, the second resonance, the third resonance, the fourth resonance, the fifth resonance, and the sixth resonance partially overlap.

11. The electronic device according to claim 1, wherein
the electronic device further comprises a frame, a part of the frame has a first position, a second position, a third position, and a fourth position in sequence, a part of the frame between the first position and the second position is used as the second radiator, a part of the frame between the second position and the third position is used as the first radiator, and a part of the frame between the third position and the fourth position is used as the third radiator;
the first gap is provided at the second position of the frame; and
the second gap is provided at the third position of the frame.

12. The electronic device according to claim 11, wherein
a first medium is disposed between the PCB and the first radiator, the second radiator, and the third radiator.

13. The electronic device according to claim 1, wherein
a projection of the first end of the first radiator and a projection of the first end of the second radiator in a first direction at least partially overlap, and form the first gap, wherein the first direction is a direction perpendicular to a plane on which the first dielectric board or the second dielectric board is located; and a projection of the second end of the first radiator and a projection of the first end of the third radiator in the first direction at least partially overlap, and form the second gap.

14. The electronic device according to claim 1, wherein a second medium is disposed in the first gap or the second gap.

15. The electronic device according to claim 1, wherein the electronic device further comprises a ground element, a first end of the ground element is electrically coupled to the first radiator at the ground point, and a second end of the ground element is grounded.

16. The electronic device according to claim 15, wherein the ground element is a capacitor.

17. The electronic device according to claim 1, wherein the electronic device further comprises a matching network and a feed unit, a first end of the matching network is electrically connected to the first radiator at the feed point, and a second end of the matching network is electrically connected to the feed unit.

\* \* \* \* \*